US011243262B2

(12) United States Patent
Ukumori

(10) Patent No.: US 11,243,262 B2
(45) Date of Patent: Feb. 8, 2022

(54) DEGRADATION ESTIMATION APPARATUS, COMPUTER PROGRAM, AND DEGRADATION ESTIMATION METHOD

(71) Applicant: GS Yuasa International Ltd., Kyoto (JP)

(72) Inventor: Nan Ukumori, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 0 days.

(21) Appl. No.: 16/981,865

(22) PCT Filed: Mar. 14, 2019

(86) PCT No.: PCT/JP2019/010544
§ 371 (c)(1),
(2) Date: Sep. 17, 2020

(87) PCT Pub. No.: WO2019/181729
PCT Pub. Date: Sep. 26, 2019

(65) Prior Publication Data
US 2021/0033680 A1 Feb. 4, 2021

(30) Foreign Application Priority Data
Mar. 20, 2018 (JP) .............................. JP2018-053017

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/382* (2019.01); *H01M 10/48* (2013.01)

(58) Field of Classification Search
CPC .. G01R 31/392; G01R 31/367; G01R 31/382; H01M 10/48
See application file for complete search history.

(56) References Cited

U.S. PATENT DOCUMENTS 7,554,296 B2    6/2009  Mizuno et al.
2006/0181245 A1 8/2006  Mizuno et al.
(Continued)

FOREIGN PATENT DOCUMENTS

JP    H09-243716 A    9/1997
JP    2001-325582 A   11/2001
(Continued)

OTHER PUBLICATIONS

International Searching Authority, International Search Report and Written Opinion for International Application No. PCT/JP2019/010544, dated Jun. 11, 2019, (10 pages), Japan Patent Office, Tokyo, Japan.

(Continued)

*Primary Examiner* — Raymond L Nimox
(74) *Attorney, Agent, or Firm* — Alston & Bird LLP

(57) ABSTRACT

This deterioration estimation device is provided with: an SOH acquisition unit which acquires the SOH of a power storage element at a first time and the SOH at a second time after the first time; and a learning processing unit which trains a learning model on the basis of learning data which, as input data, includes time series data relating to the state of the power storage element from the first time to the second time, and the SOH at the first time and, as output data, includes the SOH at the second time.

17 Claims, 30 Drawing Sheets

(51) Int. Cl.
*G01R 31/382* (2019.01)
*H01M 10/48* (2006.01)

(56) References Cited

U.S. PATENT DOCUMENTS

| | | |
|---|---|---|
| 2008/0234956 A1 | 9/2008 | Mizuno et al. |
| 2013/0110429 A1 | 5/2013 | Mitsuyama et al. |
| 2015/0112891 A1* | 4/2015 | Watanabe ............... G06N 20/00 706/1 |
| 2016/0161567 A1* | 6/2016 | Park ................... G01R 31/3648 702/63 |
| 2016/0202324 A1* | 7/2016 | Biletska ................... B60L 3/12 702/63 |
| 2016/0209473 A1* | 7/2016 | You ....................... G01R 31/367 |
| 2016/0239759 A1* | 8/2016 | Sung ....................... G06N 7/005 |
| 2016/0259014 A1* | 9/2016 | Adagouda Patil ... G01R 31/392 |
| 2017/0205469 A1* | 7/2017 | Song ..................... G01R 31/382 |
| 2017/0328957 A1 | 11/2017 | Suzuki et al. |
| 2018/0115024 A1 | 4/2018 | Sugeno et al. |
| 2018/0136285 A1* | 5/2018 | You .......................... B60L 58/12 |
| 2018/0143257 A1* | 5/2018 | Garcia ................. G01R 31/382 |

FOREIGN PATENT DOCUMENTS

| | | |
|---|---|---|
| JP | 2006-220616 A | 8/2006 |
| JP | 2007-240308 A | 9/2007 |
| JP | 2008-232758 A | 10/2008 |
| JP | 2011-214843 A | 10/2011 |
| JP | 2014-160039 A | 9/2014 |
| JP | 2016-090346 A | 5/2016 |
| WO | WO-2016/092811 A1 | 6/2016 |
| WO | WO-2016/208251 A1 | 12/2016 |
| WO | WO-2017/002292 A1 | 1/2017 |

OTHER PUBLICATIONS

Lin, Xue et al. *Machine Learning-Based Energy Management In A Hybrid Electric Vehicle To Minimize Total Operating Cost*, In 2015 IEEE/ACM International Conference on Computer-Aided Design (ICCAD), Nov. 2, 2015, pp. 627-634, IEEE. DOI: 10.1109/ICCAD.2015.7372628.

Chang, Wen-Yeau. *The State Of Charge Estimating Methods For Battery: A Review*, Hindawi Publishing Corporation, ISRN Applied Mathematics, vol. 2013, Jan. 1, 2013, pp. 1-7. http:dx.doi.org/10.1155/2013/953792. XP055460880.

* cited by examiner

Fig. 13

Energy storage device Bi

| Input data for learning | | Output data for learning | |
|---|---|---|---|
| SOC at time t1 | SOCt1 | SOH at time t90 | SOHt90 |
| SOC at time t2 | SOCt2 | | |
| ⋮ | ⋮ | | |
| SOC at time t90 | SOCt90 | | |
| Temperature at time t1 | Tt1 | | |
| Temperature at time t2 | Tt2 | | |
| ⋮ | ⋮ | | |
| Temperature at time t90 | Tt90 | | |
| SOH at time t1 | SOHt1 | | |

Fig. 14

Energy storage device Bi

| Input data for learning | | Output data for learning | |
|---|---|---|---|
| SOC at time t1 | SOCt1 | SOH at time t90 | SOHt90 |
| SOC at time t2 | SOCt2 | | |
| ⋮ | ⋮ | | |
| SOC at time t90 | SOCt90 | | |
| Temperature at time t1 | Tt1 | | |
| Temperature at time t2 | Tt2 | | |
| ⋮ | ⋮ | | |
| Temperature at time t90 | Tt90 | | |
| SOH at time t1 | SOHt1 | | |
| Elapsed period from manufacturing point to time t1 | Dt1 | | |
| Cycle number from manufacturing point to time t1 | Ct1 | | |

Fig. 16

| Input data for life expectation | |
|---|---|
| SOC at time te1 (present) | SOCte1 |
| SOC at time te2 | SOCte2 |
| ⋮ | ⋮ |
| SOC at time te90 (prediction target point) | SOCte90 |
| Temperature at time te1 (present) | Tte1 |
| Temperature at time te2 | Tte2 |
| ⋮ | ⋮ |
| Temperature at time te90 (prediction target point) | Tte90 |
| SOH at time te1 (present) | SOHte1 |

Fig. 17

| Input data for life expectation | |
|---|---|
| SOC at time te1 (present) | SOCte1 |
| SOC at time te2 | SOCte2 |
| ⋮ | ⋮ |
| SOC at time te90 (prediction target point) | SOCte90 |
| Temperature at time te1 (present) | Tte1 |
| Temperature at time te2 | Tte2 |
| ⋮ | ⋮ |
| Temperature at time te90 (prediction target point) | Tte90 |
| SOH at time te1 (present) | SOHte1 |
| Elapsed period from manufacturing point to time te1 (present) | Dte1 |
| Cycle number from manufacturing point to time te1 (present) | Cte1 |

Fig. 23
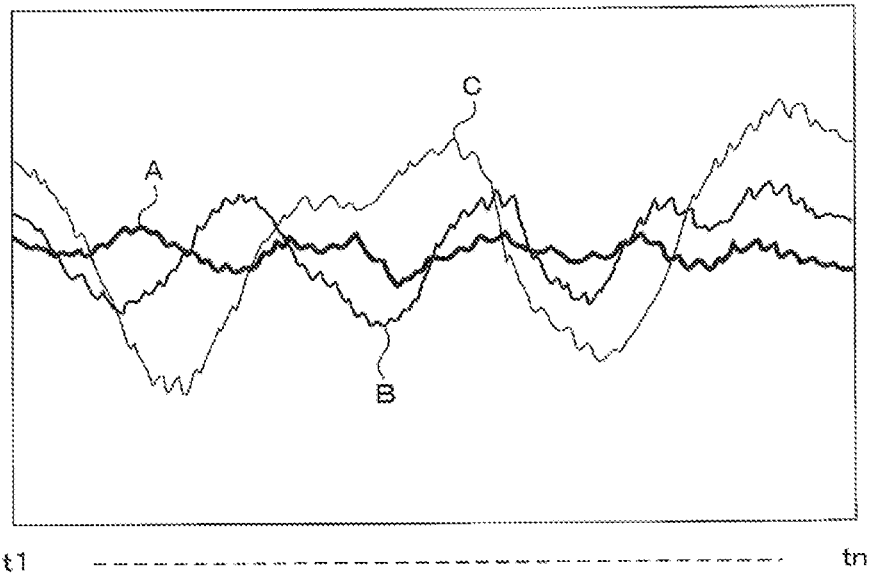
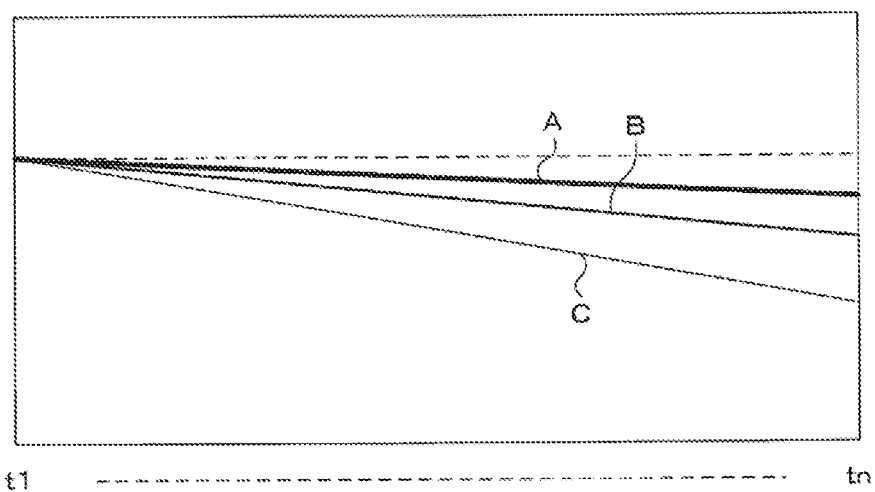

Fig. 24
A
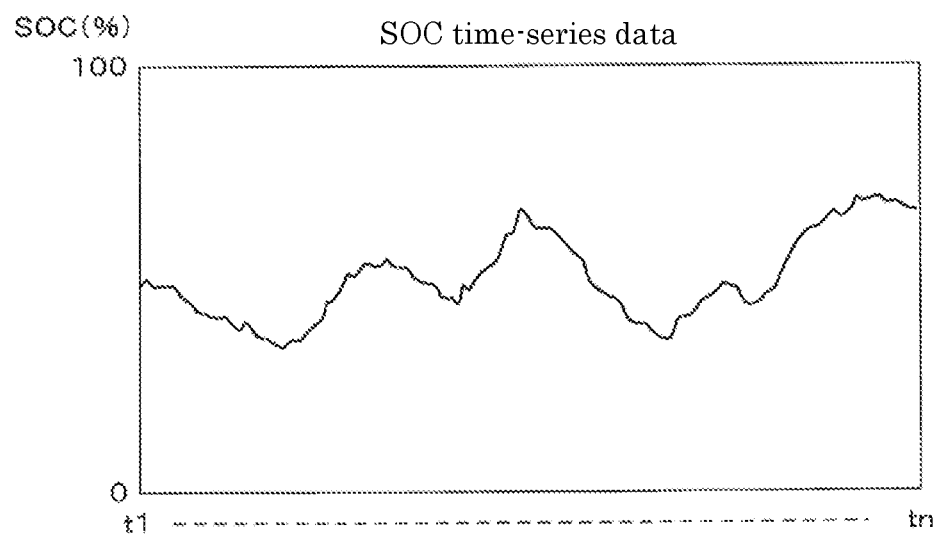
B Two-dimensional SOC image
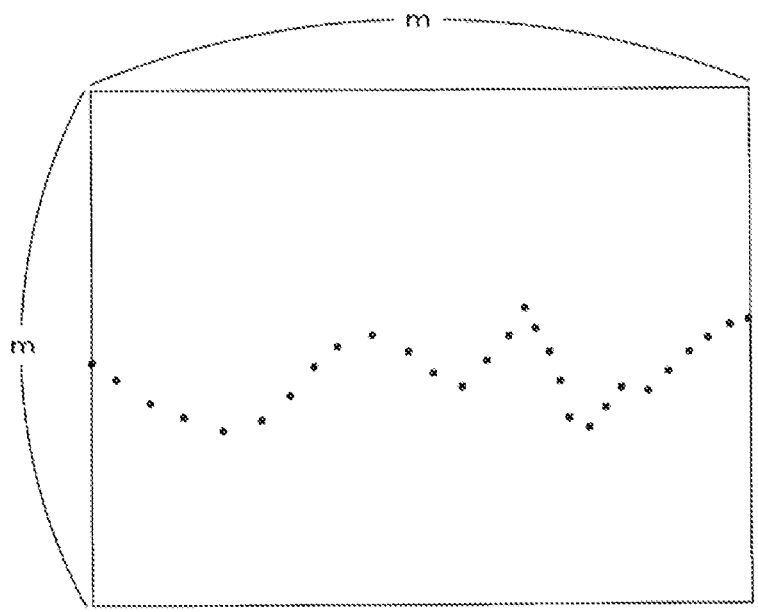

Fig. 25
A
Temperature (°C)        Temperature time-series data
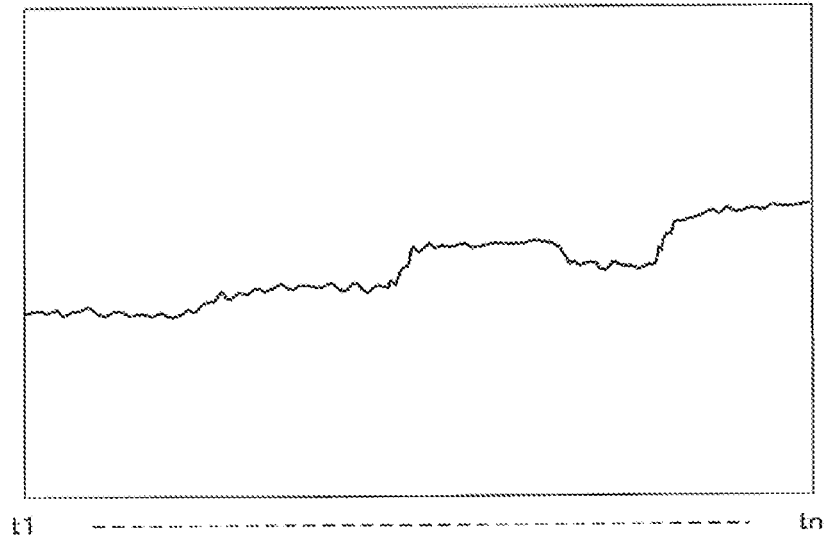
B        Two-dimensional temperature image
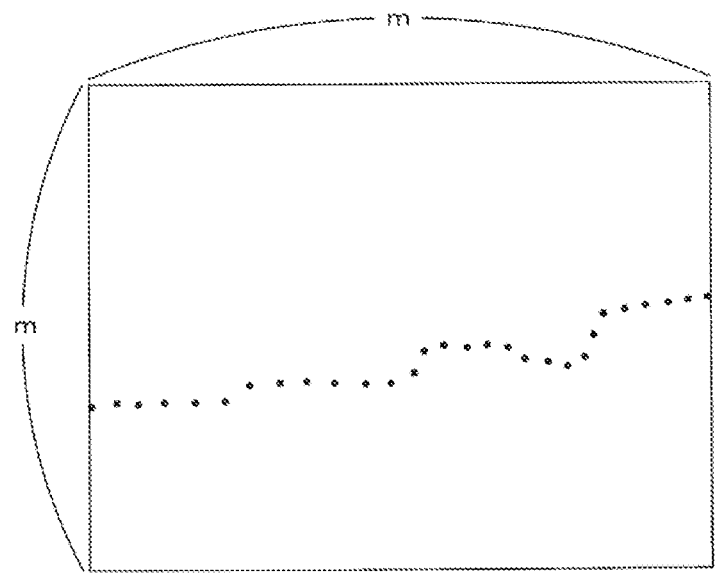

Fig. 27

Data for learning, using estimated value of degration simulator

| No. | Input data for learning | Output data for learning |
|---|---|---|
| 1 | Two-dimensional SOC image | SOH at time point tn |
| | Two-dimensional temperature image | |
| | SOH at time point t1 | |
| 2 | Two-dimensional SOC image | SOH at time point tn |
| | Two-dimensional temperature image | |
| | SOH at time point t1 | |
| 3 | Two-dimensional SOC image | SOH at time point tn |
| | Two-dimensional temperature image | |
| | SOH at time point t1 | |
| ⋮ | ⋮ | ⋮ |

Fig. 28

Data for learning, using measured value

| No. | Input data for learning | Output data for learning |
|---|---|---|
| 1 | Two-dimensional SOC image | SOH at second time point |
|   | Two-dimensional temperature image | |
|   | SOH at first time point | |
| 2 | Two-dimensional SOC image | SOH at second time point |
|   | Two-dimensional temperature image | |
|   | SOH at first time point | |
| 3 | Two-dimensional SOC image | SOH at second time point |
|   | Two-dimensional temperature image | |
|   | SOH at first time point | |
| ⋮ | ⋮ | ⋮ |

DEGRADATION ESTIMATION APPARATUS, COMPUTER PROGRAM, AND DEGRADATION ESTIMATION METHOD

CROSS REFERENCE TO RELATED APPLICATIONS

This application is a national stage application, filed under 35 U.S.C. § 371, of International Application No. PCT/JP2019/010544, filed Mar. 14, 2019, which international application claims priority to and the benefit of Japanese Application No. 2018-053017, filed Mar. 20, 2018; the contents of both of which as are hereby incorporated by reference in their entireties.

BACKGROUND

Technical Field

The present invention relates to a degradation estimation apparatus, a computer program, and a degradation estimating method.

Description of Related Art

An energy storage device has been widely used in an uninterruptible power supply, a DC or AC power supply included in a stabilized power supply, and the like. In addition, the use of energy storage devices in large-scale systems that store renewable energy or electric power generated by existing power generating systems is expanding.

An energy storage module has a configuration in which energy storage cells are connected in series. It is known that degradation of an energy storage cell progresses by repeating charge and discharge. Patent Document JP-A-2008-232758 discloses a technique of detecting a state of charge (SOC) of a secondary battery for a vehicle by inputting a battery voltage detected by a temperature sensor to a neural network unit having learned from the necessity of capacity management and safety management.

BRIEF SUMMARY

For the calculation of the SOC, for example, a method such as a current integration method is used. It is possible to calculate the SOC with relatively short time current data. Therefore, data for learning for causing the neural network unit to learn can be collected easily. However, a change in a state of health (SOH) of the energy storage device takes more time than a change in the SOC, and the related history information becomes enormous, thus making it not easy to estimate the SOH change by using the data as input. On the other hand, it is expected that the estimation of the SOH change based on detailed history information of the energy storage device and a virtual use condition experienced by the energy storage device in the future will be combined and applied to life prediction of the battery.

An object of the present invention is to provide a degradation estimation apparatus, a computer program, and a degradation estimation method for estimating degradation of an energy storage device by using Artificial Intelligence (AI).

A degradation estimation apparatus for estimating degradation of an energy storage device includes: a SOH acquisition unit that acquires a SOH of an energy storage device at a first time point and a SOH at a second time point after the first time point; and a learning processing unit that causes a learning model to learn based on learning data with time-series data relating to a state of the energy storage device from the first time point to the second time point and the SOH at the first time point as input data and with the SOH at the second time point as output data.

A computer program for causing a computer to estimate degradation of an energy storage device causes the computer to perform the processing of: acquiring a SOH of an energy storage device at a first time point and a SOH at a second time point after the first time point; and causing a learning model to learn based on learning data with time-series data relating to a state of the energy storage device from the first time point to the second time point and the SOH at the first time point as input data and with the SOH at the second time point as output data.

A degradation estimation method for estimating degradation of an energy storage device includes: acquiring a state of SOH of an energy storage device at a first time point and a SOH at a second time point after the first time point; and causing a learning model to learn based on learning data with time-series data relating to a state of the energy storage device from the first time point to the second time point and the SOH at the first time point as input data and with the SOH at the second time point as output data.

The SOH acquisition unit acquires the SOH of the energy storage device at the first time point and the SOH at the second time point after the first time point. The energy storage device may be, for example, an energy storage device operating in a mobile body or a facility. Sensor information (e.g., current, voltage, and temperature) can be collected from the energy storage device by using a monitoring apparatus or the like. The SOH can be estimated by a known method based on the sensor information. Alternatively, the SOH may be estimated using a method described in Japanese Patent Application No. 2017-065532 (its entire contents are incorporated herein by reference). The period between the first time point and the second time point can be appropriately set and may be, for example, one month or three months. When the sensor information has periodicity, the period between the first time point and the second time point may be divided by the cycle of the sensor information. At that time, an interpolation value at the first and second time points may be used for the SOH.

The degree to which the SOH at the second time point has been lower than the SOH at the first time point (degradation is progressing) depends on a use state of the energy storage device from the first time point to the second time point. Hence, it is conceivable that time-series data relating to a state of the energy storage device, for example, time-series data relating to the state (e.g., use state) of the energy storage device from the first time point to the second time point, is specified from the sensor information of the energy storage device.

The learning processing unit causes the learning model to learn based on learning data with the time-series data relating to the state of the energy storage device from the first time point to the second time point and the SOH at the first time point as input data and with the SOH at the second time point as output data. For example, the SOH at the first time point is represented by SOH(N), and the SOH at the second time point is represented by SOH(N+1). The learning model learns that the SOH at the first time point is SOH(N) and how the state of the energy storage device from the first time point to the second time point transitions to make the SOH at the second time point become SOH(N+1) Such learning data can be collected in large quantities as sensor information from many energy storage devices operating in a mobile body or facility. As described below, when the SOH at a certain time point (e.g., at present) and the use condition of the energy storage device from time point to a prediction target point after a degradation estimation period (e.g., one month later, three months later, etc.) are input to the learning-completed learning model, the SOH at the prediction target point can be estimated. Thereby, the degradation of the energy storage device can be estimated using the AI.

A degradation estimation apparatus for estimating degradation of an energy storage device includes: a SOH acquisition unit that acquires a SOH at a first time point of the energy storage device; and a learning-completed learning model that uses time-series data relating to a state of the energy storage device from the first time point to the second time point and the SOH at the first time point as input data to estimate a SOH at the second time point.

A computer program for causing a computer to estimate degradation of an energy storage device causes the computer to perform the processing of: acquiring a state of health (SOH) at a first time point of an energy storage device; and inputting time-series data relating to a state of the energy storage device from the first time point to the second time point and the SOH at the first time point to a learning-completed learning model to estimate a SOH at the second time point.

A degradation estimation method for estimating degradation of an energy storage device include: acquiring a SOH at a first time point of the energy storage device; and inputting time-series data relating to a state of the energy storage device from the first time point to the second time point and the SOH at the first time point to a learning-completed learning model to estimate a SOH at the second time point.

The SOH acquisition unit acquires the SOH of the energy storage device at the first time point. Sensor information (e.g., current, voltage, and temperature) can be collected from the energy storage device by using a monitoring apparatus or the like. The SOH can be estimated by a known method based on the sensor information. As the SOH at the first time point, a value estimated by a learning-completed learning model based on the SOH at a time point before the first time point can also be used. Thus, the SOH can be continuously estimated in any period.

The degree to which the SOH at the second time point has been lower than the SOH at the first time point (degradation is progressing) depends on a use state of the energy storage device from the first time point to the second time point. Therefore, it is conceivable to specify time-series data relating to the state of the energy storage device from the first time point to the second time point. The second time point is a prediction target point at which the SOH is estimated. The time-series data relating to the state of the energy storage device can be specified from the scheduled use condition of the energy storage device from the first time point to the second time point.

The learning-completed learning model uses as input data the SOH at the first time point and the time-series data relating to the state of the energy storage device from the first time point to the second time point to estimate the SOH at the second time point. Thus, when the SOH at the first time point (e.g., at present) and the scheduled use condition of the energy storage device from the first time point to the second time point (prediction target point) are known, the SOH at the second time point can be estimated. It is also possible to determine how to set the scheduled use condition of the energy storage device from the first time point to the second time point to make the SOH at the second time point larger (prevent a decrease in SOH).

The degradation estimation apparatus may include a current data acquisition unit that acquires current data of the energy storage device detected in time series, and the learning processing unit may cause the learning model to learn based on time-series data relating to the SOC of the energy storage device from the first time point to the second time point based on the current data acquired by the current data acquisition unit.

The current data acquisition unit acquires current data of the energy storage device detected in time series.

The time-series data relating to the SOC of the energy storage device can be specified based on the current data acquired by the current data acquisition unit. The time-series data relating to the SOC can be obtained, for example, by the current integration method. In a lithium ion battery, a solid electrolyte interface layer (SEI layer) is generated at an interface between an electrode and an electrolyte solution by charging and discharging or standing, and the SOH decreases as the SEI layer grows. Based on the hypothesis that the growth of the SEI layer depends on the SOC, the inventors of the present invention have proposed to cause a learning model to learn using time-series data of how the SOC of the energy storage device has transitioned over time. Thus, a learning-completed learning model capable of accurately estimating the SOH can be generated.

The degradation estimation apparatus may include: a voltage data acquisition unit that acquires voltage data of the energy storage device; and a correction unit that corrects data at a certain time point among the time-series data relating to the SOC based on the voltage data acquired by the voltage data acquisition unit.

A voltage data acquisition unit acquires voltage data of the energy storage device.

The correction unit corrects data at a certain time point among the time-series data relating to the SOC based on the voltage data acquired by the voltage data acquisition unit. For example, an open-circuit voltage (OCV) of the energy storage device can be acquired based on voltage data at a time point when the charge or discharge of the energy storage has been ended and the voltage after the elapse of the certain time is stable. The SOC can be obtained from the SOC-OCV characteristic and the obtained OCV. When the difference between the SOC obtained from the OCV and the SOC calculated by the current integration method is not less than a predetermined value, the SOC calculated by the current integration method is replaced with the SOC obtained from the OCV to reset an error by the current integration method, thereby obtaining the SOC with high accuracy.

The degradation estimation apparatus may include: a storage unit that stores current data acquired by the current data acquisition unit; and an erasing unit that erases current data from the first time point to the second time point among the current data stored in the storage unit when the learning model is caused to learn based on time-series data relating to the SOC from the first time point to the second time point.

The storage unit stores current data acquired by the current data acquisition unit.

The erasing unit erases the current data from the first time point to the second time point among the current data stored in the storage unit when the learning model is caused to learn based on the time-series data relating to the SOC from the first time point to the second time point. When the time-series data relating to the SOC from the first time point to the second time point is once specified based on the current data in order to cause the learning model to learn, the current data from the first time point to the second time point is not required. By erasing the current data from the first time point to the second time point, a storage capacity of the storage unit can be reduced. In addition, since other current data can be stored in vacant storage capacity by the erasing, a large amount of sensor information can be stored. When the current data is erased, the previous sensor information may be compressed and held as previous history, and the previous history may be reflected by inputting the previous history to the neural network.

The degradation estimation apparatus may include a temperature data acquisition unit that acquires temperature data of the energy storage device detected in time series, and the learning processing unit causes the learning model to learn based on learning data with time-series data relating to temperature data of the energy storage device from the first time point to the second time point as input data.

The temperature data acquisition unit acquires temperature data of the energy storage device detected in time series.

The learning processing unit causes a learning model to learn based on learning data with the time-series data relating to the temperature data of the energy storage device from the first time point to the second time point as input data. The decrease in the SOH of the energy storage device depends on the temperature of the energy storage device. Therefore, by causing the learning model to learn using the time-series data of how the temperature of the energy storage device has transitioned over time, it is possible to generate a learning-completed learning model that can accurately estimate the SOH.

In the degradation estimation apparatus, the learning processing unit may cause the learning model to learn based on learning data with an elapsed period from a point of manufacturing the energy storage device to the first time point as input data.

The learning processing unit causes a learning model to learn based on learning data with an elapsed period from the point of manufacturing the energy storage device to the first time point as additional input data. The SOH of the energy storage device decreases with the standing time (calendar degradation). The decrease in SOH after the first time point is considered to depend on the length of time elapsed from the point of manufacturing (e.g., the point of completion of manufacturing) to the first time point. Therefore, by further generating learning data with the elapsed period from the point of manufacturing the energy storage device to the first time point as input data, it is possible to generate a learning-completed learning model that can accurately estimate the SOH.

In the degradation estimation apparatus, the learning processing unit may cause the learning model to learn based on learning data with a total energized electricity amount from the point of manufacturing the energy storage device to the first time point as input data.

The learning processing unit causes a learning model to learn based on learning data with a total amount of energized electricity (e.g., a cycle number when the cycle number can be specified) from the point of manufacturing the energy storage device to the first time point as input data. The SOH of the energy storage device decreases with the cycle number (cycle degradation). The decrease in SOH after the first time point is considered to depend somewhat on the cycle number from the point of manufacturing (e.g., the point of completion of manufacturing) to the first time point.

Therefore, when the cycle number can be specified, by further generating learning data with the cycle number from the point of manufacturing the energy storage device to the first time point as input data, a learning-completed learning model capable of accurately estimating SOH can be generated. When it is not possible to specify the cycle number, the total amount of energized electricity may be used instead of the cycle number.

In the degradation estimation apparatus, the learning processing unit may provide a plurality of learning periods from the first time point to the second time point over a use period of the energy storage device to cause the learning model to learn based on learning data.

The learning processing unit provides a plurality of learning periods from the first time point to the second time point over a use period of the energy storage device to cause a learning model to learn based on learning data. Assuming that the learning period from the first time point to the second time point is $\Delta N$, it is possible to estimate a SOH at a certain time point after the manufacturing of the energy storage device to reach the life by causing the learning model to learn using data for learning for each of the plurality of learning periods $\Delta N$ over the use period from the point of manufacturing to the life of the energy storage device, for example.

The degradation estimation apparatus may estimate the degradation of the energy storage device by using a learning-completed learning model caused to learn by the learning processing unit. Thus, when the SOH at the first time point (e.g., at present) and the scheduled use condition of the energy storage device from the first time point to the second time point (prediction target point) are known, the SOH at the second time point can be estimated. It is also possible to determine how to set the scheduled use condition of the energy storage device from the first time point to the second time point to make the SOH at the second time point larger (prevent a decrease in SOH).

A degradation estimation apparatus for estimating degradation of an energy storage device includes: an output value acquisition unit that inputs time-series data relating to a SOC to a degradation simulator configured to estimate a SOH of the energy storage device based on variation in a SOC of the energy storage device, and acquires a SOH output by the degradation simulator; an input value acquisition unit that acquires the time-series data relating to the SOC, input to the degradation simulator; a learning processing unit that uses the time-series data relating to the SOC acquired by the input value acquisition unit and the SOH acquired by the output value acquisition unit as learning data to cause a learning model to learn; a SOC acquisition unit that acquires a time-series data relating to the SOC of the energy storage device; a SOH acquisition unit that acquires a SOH of the energy storage device; and a relearning processing unit that uses the time-series data relating to the SOC acquired by the SOC acquisition unit and the SOH acquired by the SOH acquisition unit as learning data to cause relearning of the learning model caused to learn by the learning processing unit.

A computer program for causing a computer to estimate degradation of an energy storage device causes the computer to perform the processing of: inputting time-series of a SOC to a degradation simulator configured to estimate a SOH of the energy storage device based on variation in a SOC of the energy storage device, and acquiring a SOH output by the degradation simulator; acquiring the time-series data relating to the SOC, input to the degradation simulator; using the acquired time-series data relating to the SOC and the acquired SOH as learning data to cause a learning model to learn; acquiring a time-series data relating to the SOC of the energy storage device; acquiring a SOH of the energy storage device; and using the acquired time-series data relating to the SOC and the acquired SOH as learning data to cause relearning of the learning model caused to learn by the learning processing unit.

A degradation estimation method for estimating degradation of an energy storage device includes: inputting time-series data relating to a SOC to a degradation simulator configured to estimate a SOH of the energy storage device based on variation in a SOC of the energy storage device, and acquires a SOH output by the degradation simulator; acquiring the time-series data relating to the SOC, input to the degradation simulator; using the acquired time-series data relating to the SOC and the acquired SOH as learning data to cause a learning model to learn; acquiring a time-series data relating to the SOC of the energy storage device; acquiring a SOH of the energy storage device; and using the acquired time-series data relating to the SOC and the acquired SOH as learning data to cause relearning of the learning model caused to learn by the learning processing unit.

The output value acquisition unit acquires the SOH output by the degradation simulator when the time-series data relating to the SOC is input to the degradation simulator configured to estimate the SOH of the energy storage device based on variation in the SOC of the energy storage device.

The degradation simulator can estimate the degradation value of the SOH of the energy storage device based on the time-series data relating to the SOC and the temperature of the energy storage device. A degradation value Qdeg after the lapse of the degradation prediction target period (e.g., from time point t1 to time point tn) of the energy storage device can be calculated by a formula Qdeg=Qcnd+Qcur. Here, Qcnd is a non-energization degradation value and Qcur is an energization degradation value. The non-energization degradation value Qcnd can be obtained by, for example, $Qcnd = K1 \times \sqrt{(t)}$. Here, a coefficient K1 is a function of a SOC and a temperature T. "t" is an elapsed time, for example, the time from time point t1 to time point tn. The energization degradation value Qcur can be obtained by, for example, $Qcur = K2 \times \sqrt{(t)}$. Here, the coefficient K2 is a function of the SOC and the temperature T. Assuming that the SOH at time point t1 is SOHt1 and the SOH at time point tn is SOHtn, the SOH can be estimated by SOHtn=SOHt1−Qdeg. The coefficient K1 is a degradation coefficient, and the correspondence relation between each of the SOC and the temperature T and the coefficient K1 may be obtained by calculation or stored in a table form. Here, the SOC can be time-series data. A coefficient K2 is the same as the coefficient K1.

An input value acquisition unit acquires time-series data relating to the SOC input to the degradation simulator.

The learning processing unit uses the time-series data relating to the SOC acquired by the input value acquisition unit and the SOH acquired by the output value acquisition unit as learning data to cause a learning model to learn. When various pieces of SOC time-series data is input to the degradation simulator, the degradation simulator outputs a degradation value (i.e., SOH) with high accuracy with respect to the input time-series data of each of the SOCs. Various SOC time-series data can be relatively easily generated for simulation, thereby facilitating the generation of data for learning of a learning model and the improvement in the estimation accuracy (percentage of correct answers) of the learning model.

The SOC acquisition unit acquires time-series data relating to the SOC of the energy storage device. The SOH acquisition unit acquires the SOH of the energy storage device. Sensor information (e.g., current, voltage, and temperature) can be collected from the energy storage device. The SOH can be estimated by a known method based on the sensor information. Alternatively, the SOH may be estimated using a method described in Japanese Patent Application No. 2017-065532 (its entire contents are incorporated herein by reference).

The relearning processing unit uses the acquired time-series data relating to the SOC and the acquired SOH as learning data to cause a learning model, caused to learn by the learning processing unit, to relearn. The SOC time-series data or the SOH obtained by collecting sensor information tends to require a large amount of data for learning in order to enhance the estimation accuracy (percentage of correct answers) of the learning model, for example, when the temporal variation becomes complicated and learning model not having learned is caused to learn using these pieces of data as data for learning. By using the degradation simulator in advance, the learning data can be obtained relatively easily, and the estimation accuracy of the learning model not having learned can be enhanced. Therefore, by relearning processing, the accuracy of the learning model can be further enhanced even without a large amount of data for learning, and the accuracy of the degradation estimation of the energy storage device can be enhanced.

In the degradation estimation apparatus, the SOH acquisition unit acquires a SOH of the energy storage device at a first time point and a SOH at a second time point after the first time point, and the SOC acquisition unit acquires time-series data relating to the SOC of the energy storage device from the first time point to the second time point.

The SOH acquisition unit acquires the SOH of the energy storage device at the first time point and the SOH at the second time point after the first time point. Sensor information (e.g., current, voltage, and temperature) can be collected from the energy storage device. The SOH can be estimated by a known method based on the sensor information. Alternatively, the SOH may be estimated using a method described in Japanese Patent Application No. 2017-065532 (its entire contents are incorporated herein by reference). The period between the first time point and the second time point can be appropriately set and may be, for example, one month or three months. When the sensor information has periodicity, the period between the first time point and the second time point may be divided by the cycle of the sensor information. At that time, an interpolation value at the first and second time points may be used for the SOH.

The SOC acquisition unit acquires time-series data relating to the SOC of the energy storage device from the first time point to the second time point. The time-series data relating to the SOC can be obtained, for example, by the current integration method based on the current data obtained by the sensor information.

The relearning processing unit causes the learning model, caused to learn by the learning processing unit, to relearn based on learning data with the time-series data relating to the SOC of the energy storage device from the first time point to the second time point and the SOH at the first time point as input data and with the SOH at the second time point as output data. For example, the SOH at the first time point is represented by SOH(N), and the SOH at the second time point is represented by SOH(N+1). The learning model relearns that the SOH at the first time point is SOH(N), and how the temporal variation in the SOC of the energy storage device from the first time point to the second time point transitions to make the SOH at the second time point become SOH(N+1) Thereby, when the SOH at a certain time point (e.g., at present) and the use condition of the energy storage device from time point to a prediction target point after a degradation estimation period (e.g., one month later, three months later, etc.) are input to the learning model, the SOH at the prediction target point can be estimated. Thereby, the degradation of the energy storage device can be estimated using the AI.

In the degradation estimation apparatus, the learning model has a convolutional neural network, the apparatus comprises a two-dimensional data generation unit that generates two-dimensional SOC data containing a plurality of time points and SOC values at the respective plurality of time points based on the time-series data relating to the SOC acquired by the input value acquisition unit, and the learning processing unit uses the two-dimensional SOC data generated by the two-dimensional data generation unit as learning data to cause the learning model to learn.

The learning model has a convolutional neural network.

The two-dimensional data generation unit generates two-dimensional SOC data containing a plurality of time points and SOC values at the respective plurality of time points based on the time-series data relating to the SOC acquired by the input value acquisition unit (i.e., the SOC time-series data input to the degradation simulator). Two-dimensional SOC data is treated as a two-dimensional image (also referred to as two-dimensional SOC image). For example, assuming that a two-dimensional SOC image is an image made up of pixels of length×width=m×m, SOC time-series data from time point t1 to time point tn can be generated as a two-dimensional image by assigning 0% to 100% of the SOC to the m vertical pixels and assigning a time period from time point t1 to time point tn to the m horizontal pixels. In the two-dimensional SOC image, the pixel to which the SOC value is assigned can be "1," and the pixel to which the SOC value is not assigned can be "0."

The learning processing unit uses the two-dimensional SOC data generated by the two-dimensional data generation unit as learning data to cause a learning model to learn. That is, the learning model having the convolutional neural network can be caused to learn by generating the two-dimensional SOC image from the SOC time-series data input to the degradation simulator. The temporal variation in the SOC can be captured as a change in the position of the pixel on the image to cause the learning model to learn. Thereby, the learning model can be caused to learn so as to enable accurate estimation of the change (degradation value) of the SOH due to the variation in the SOC.

In the degradation estimation apparatus, the two-dimensional data generation unit generates two-dimensional SOC data containing a plurality of time points and SOC values at the respective plurality of time points based on the time-series data relating to the SOC acquired by the SOC acquisition unit, and the relearning processing unit uses the two-dimensional SOC data generated by the two-dimensional data generation unit as learning data to cause the learning model, caused to learn by the learning processing unit, to relearn.

The two-dimensional data generation unit generates two-dimensional SOC data containing a plurality of time points and SOC values at the respective plurality of time points based on the time-series data relating to the SOC acquired by the SOC acquisition unit. In this case, the time-series data relating to the SOC can be obtained by the current integration method based on the current data obtained, for example, by the sensor information.

The relearning processing unit causes the learning model, caused to learn by the learning processing unit, to relearn using the two-dimensional SOC data generated by the two-dimensional data generation unit as learning data. That is, the learning model having the convolutional neural network can be caused to learn by generating the two-dimensional SOC image from the SOC time-series data obtained from the sensor information. The temporal variation in the SOC can be captured as a change in the position of the pixel on the image to cause the learning model to relearn. Thereby, the learning model can be caused to relearn so as to enable accurate estimation of the change (degradation value) of the SOH due to the variation in the SOC.

In the degradation estimation apparatus, the output value acquisition unit acquires a SOH that is output by the degradation simulator to which time-series data relating to a temperature is input together with the time-series data relating to the SOC.

The output value acquisition unit acquires a SOH that is output by the degradation simulator to which time-series data relating to a temperature is input together with the time-series data relating to the SOC. Thus, as compared with a case where, for example, the average temperature is used as the temperature data to be input to the degradation simulator, the degradation value can be estimated in consideration of variation in temperature, so that the estimation accuracy of the learning model can be improved.

In the degradation estimation apparatus, the input value acquisition unit acquires time-series data relating to the temperature input to the degradation simulator, and the learning processing unit uses the time-series data relating to the temperature acquired by the input value acquisition unit and the SOH acquired by the output value acquisition unit as learning data to cause the learning model to learn.

An input value acquisition unit acquires time-series data relating to the temperature input to the degradation simulator.

The learning processing unit uses the time-series data relating to the temperature acquired by the input value acquisition unit and the SOH acquired by the output value acquisition unit as learning data to cause a learning model to learn. Thus, the learning model can be caused to learn in consideration of temperature variation as well, and the estimation accuracy of the learning model can be improved.

The degradation estimation apparatus includes a temperature data acquisition unit that acquires temperature data of the energy storage device detected in time series, and the relearning processing unit uses the temperature data acquired by the temperature data acquisition unit and the SOH acquired by the SOH acquisition unit as learning data to cause the learning model, caused to learn by the learning processing unit, to relearn.

The temperature data acquisition unit acquires temperature data of the energy storage device detected in time series.

The relearning processing unit causes the learning model, caused to learn by the learning processing unit, to relearn using, as learning data, the temperature data acquired by the temperature data acquisition unit and the SOH acquired by the SOH acquisition unit. Thus, the learning model can be caused to relearn in consideration of temperature variation as well, and the estimation accuracy of the learning model can be improved.

A degradation estimation apparatus for estimating degradation of an energy storage device includes: a learning model. The learning model is caused to learn using, as learning data: time-series data relating to a SOC to be input to a degradation simulator configured to estimate the SOH of the energy storage device based on variation in the SOC of the energy storage device; and a SOH output by the degradation simulator when the time-series data relating to the SOC is input to the degradation simulator. The learning model has been further caused to relearn the time-series data relating to the SOC of the energy storage device and the SOH of the energy storage device as learning data, the apparatus including: a SOH acquisition unit that acquires a SOH of the energy storage device at a first time point; and a SOC acquisition unit that acquires time-series data relating to the SOC of the energy storage device from the first time point to the second time point. The SOH at the first time point and the time-series data relating to the SOC acquired by the SOC acquisition unit are input to the learning model to estimate the SOH at the second time point.

A computer program for causing a computer to estimate degradation of an energy storage device causes the computer to perform the processing of: acquiring a SOH of an energy storage device at a first time point; acquiring time-series data relating to a SOC of the energy storage device from the first time point to a second time point; and estimating the SOH at the second time point by inputting to a learning model. The learning model is caused to learn using, as learning data at the first time point: time-series data relating to the SOC to be input to a degradation simulator configured to estimate the SOH of the energy storage device based on variation in the SOC of the energy storage device; and a SOH to be output by the degradation simulator when the time-series data relating to the SOC is input to the degradation simulator. The learning model is further caused to relearn using the time-series data relating to the SOC of the energy storage device and the SOH of the energy storage device as learning data.

A degradation estimation method for estimating degradation of an energy storage device includes: acquiring a SOH of an energy storage device at a first time point; acquiring time-series data relating to a SOC of the energy storage device from the first time point to a second time point; and inputting the SOH at the time-series data relating to the SOH to a learning model caused to learn using as learning data at the first time point, time-series data relating to the SOC to be input to a degradation simulator configured to estimate the SOH of the energy storage device based on variation in the SOC of the energy storage device and a SOH to be output by the degradation simulator when the time-series data relating to the SOC is input to the degradation simulator, the learning model being further caused to relearn using the time-series data relating to the SOC of the energy storage device and the SOH of the energy storage device as learning data to estimate the SOH at the second time point.

The learning model has caused to learn using, as learning data at the first time point, time-series data relating to the SOC to be input to a degradation simulator configured to estimate the SOH of the energy storage device based on variation in the SOC of the energy storage device and a SOH to be output by the degradation simulator when the time-series data relating to the SOC is input to the degradation simulator. The learning model has been further caused to relearn using the time-series data relating to the SOC of the energy storage device and the SOH of the energy storage device as learning data.

By using the degradation simulator in advance, the learning data can be obtained relatively easily, and the estimation accuracy of the learning model not having learned can be enhanced. Further, by relearning, the accuracy of the learning model can be further enhanced even without a large amount of data for learning, and the accuracy of the degradation estimation of the energy storage device can be enhanced.

The SOH acquisition unit acquires the SOH of the energy storage device at the first time point. The SOC acquisition unit acquires time-series data relating to the SOC of the energy storage device from the first time point to the second time point. The SOH at the first time point and the acquired time-series data relating to the SOC are input to the learning model, and the SOH at the second time point is estimated.

When the SOH at a certain time point (e.g., at present) and the SOC time-series data from time point to a prediction target point are input to a learning-completed or relearning-completed learning model, a SOH at the prediction target point can be estimated. Thereby, the degradation of the energy storage device can be estimated using the AI.

BRIEF DESCRIPTION OF THE FIGURES

FIG. 13 is a block diagram showing an example of data for learning.

FIG. 14 is a block diagram showing another example of the data for learning.

FIG. 16 is a block diagram showing an example of input data for life estimation.

FIG. 17 is a block diagram showing another example of the input data for life estimation.

FIG. 23 is a schematic diagram showing an example of SOH estimation by the degradation simulator.

FIG. 24 is a schematic diagram showing an example of generating a two-dimensional SOC image from SOC time-series data.

FIG. 25 is a schematic diagram showing an example of generating a two-dimensional temperature image from temperature time-series data.

FIG. 27 is a block diagram showing an example of data for learning with estimated values of the degradation simulator.

FIG. 28 is a block diagram showing an example of data for learning with measured values.

DETAILED DESCRIPTION OF VARIOUS EMBODIMENTS

First Embodiment

Figure 1:
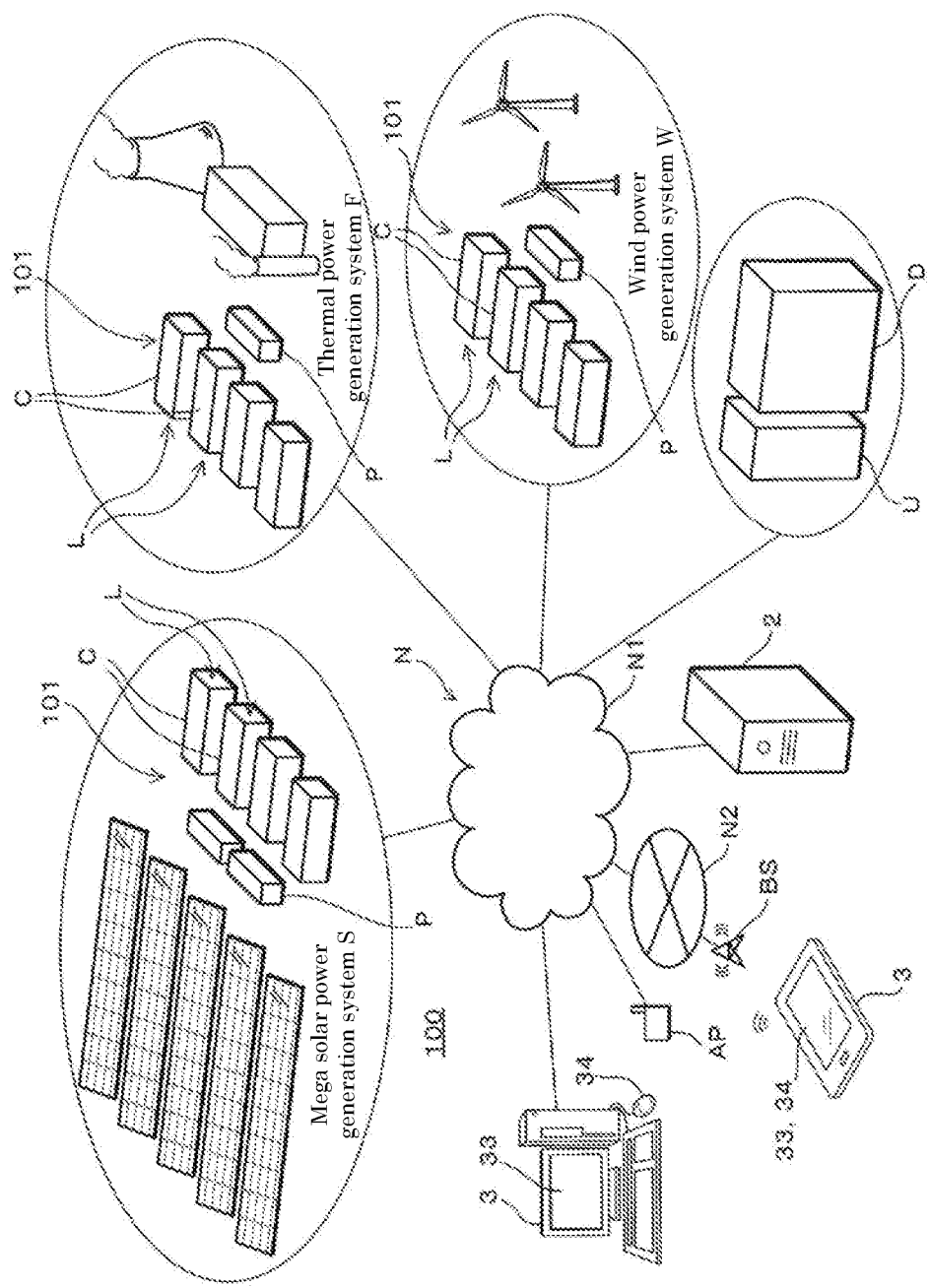
FIG. 1 is a diagram showing an outline of a remote monitoring system of the present embodiment.

Hereinafter, a degradation estimation apparatus according to the present embodiment will be described with reference to the drawings. FIG. 1 is a diagram showing an outline of a remote monitoring system 100 of the present embodiment. As shown in FIG. 1, a thermal power generation system F, a mega solar power generation system S, a wind power generation system W, a uninterruptible power supply (UPS) U, a rectifier (d.c. power supply or a.c. power supply) D disposed in a stabilized power supply system for railways, and the like are connected to a network N including a public communication network (e.g., the Internet) N1, a carrier network N2 that achieves wireless communication based on a mobile communication standard, and the like. A communication device 1 to be described later, a server apparatus 2 that collects information from the communication device 1 and serves as a degradation estimation apparatus, and a client apparatus 3 that acquires the collected information are connected to the network N. In the present embodiment, the degradation estimation apparatus may be a life simulator.

More specifically, the carrier network N2 includes a base station BS, and the client apparatus 3 can communicate with the server apparatus 2 from the base station BS via the network N. An access point AP is connected to the public communication network N1, and the client apparatus 3 can transmit and receive information to and from the server apparatus 2 via the network N from the access point AP.

A power conditioner (power conditioning system: PCS) P and an energy storage system 101 are attached to a mega solar power generation system S, a thermal power generation system F and a wind power generation system W. The energy storage system 101 is configured by juxtaposing a plurality of containers C each housing an energy storage module group L. The energy storage module group L has a hierarchical structure of, for example, an energy storage module (also called a module) in which a plurality of energy storage cells (also called a cell) are connected in series, a bank in which a plurality of energy storage modules are connected in series, and a domain in which a plurality of banks are connected in parallel. The energy storage device is preferably rechargeable, such as a secondary battery like a lead-acid battery or a lithium ion battery, or a capacitor. A part of the energy storage device may be a primary battery that is not rechargeable.

Figure 2:
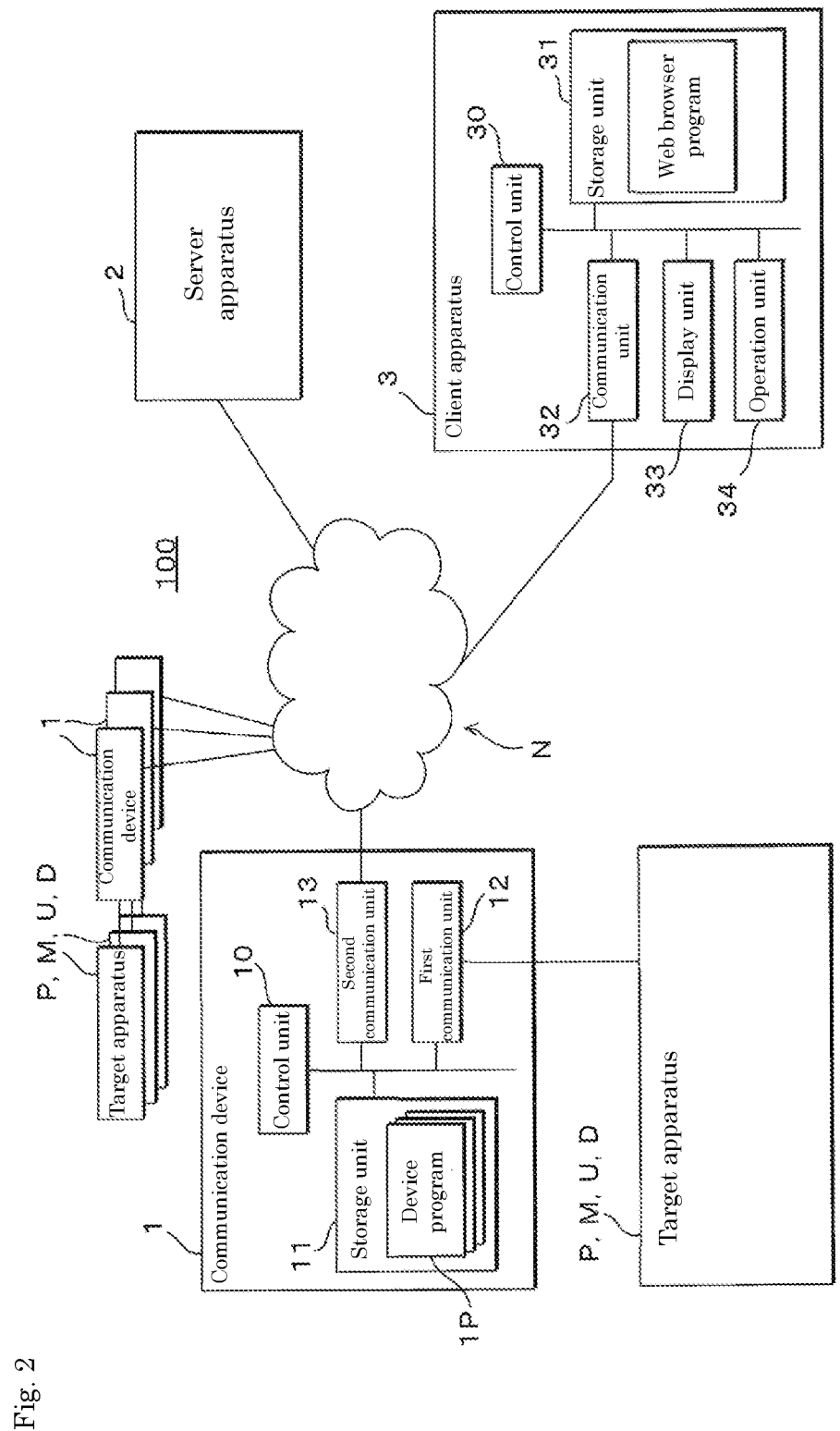
FIG. 2 is a block diagram showing an example of the configuration of the remote monitoring system.

FIG. 2 is a block diagram showing an example of the configuration of the remote monitoring system 100. The remote monitoring system 100 includes the communication device 1, a server apparatus 2, a client apparatus 3, and the like.

As shown in FIG. 2, the communication device 1 is connected to the network N and is also connected to the target apparatuses P, U, D, M. The target apparatuses P, U, D, M include a power conditioner P, an uninterruptible power supply U, a rectifier D, and a management apparatus M to be described later.

In the remote monitoring system 100, the state (e.g., voltage, current, temperature, state of charge (SOC)) of the energy storage module (energy storage cell) in the energy storage system 101 is monitored and collected by using the communication device 1 connected to each of the target apparatuses P, U, D, M. The remote monitoring system 100 presents the detected state (including a degraded state, an abnormal state, etc.) of the energy storage cell so that a user or an operator (a person in charge of maintenance) can confirm the detected state.

The communication device 1 includes a control unit 10, a storage unit 11, a first communication unit 12, and a second communication unit 13. The control unit 10 is made of a central processing unit (CPU) or the like and controls the entire communication device 1 by using built-in memories such as read-only memory (ROM) and random-access memory (RAM).

The storage unit 11 may be a nonvolatile memory such as a flash memory. The storage unit 11 stores a device program 1P to be read and executed by the control unit 10. The storage unit 11 stores information such as information collected by the processing of the control unit 10 and event logs.

The first communication unit 12 is a communication interface for achieving communication with the target apparatuses P, U, D, M and can use, for example, a serial communication interface such as RS-232 C or RS-485.

The second communication unit 13 is an interface for achieving communication via the network N and uses, for example, a communication interface such as an Ethernet (registered trademark) or a wireless communication antenna. The control unit 10 can communicate with the server apparatus 2 via the second communication unit 13.

The client apparatus 3 may be a computer used by the operator such as a manager of the energy storage system 101 of the power generation systems S, F or a person in charge of maintenance of the target apparatuses P, U, D, M. The client apparatus 3 may be a desktop type or a laptop type personal computer or may be a smartphone or a tablet type communication terminal. The client apparatus 3 includes a control unit 30, a storage unit 31, a communication unit 32, a display unit 33, and an operation unit 34.

The control unit 30 is a processor using a CPU. A control unit 30 causes a display unit 33 to display a Web page provided by the server apparatus 2 or the communication device 1 based on a Web browser program stored in a storage unit 31.

The storage unit 31 uses a nonvolatile memory such as a hard disk or a flash memory. The storage unit 31 stores various programs including a Web browser program.

The communication unit 32 can use a communication device such as a network card for wired communication, a wireless communication device for mobile communication connected to a base station BS (see FIG. 1), or a wireless communication device corresponding to connection to the access point AP. The control unit 30 enables communication connection or transmission and reception of information between the server apparatus 2 or the communication device 1 via the network N by the communication unit 32

The display unit 33 may be a liquid crystal display, an organic electroluminescence (EL) display, or the like. The display unit 33 can display an image of a Web page provided by the server apparatus 2 by processing based on the Web browser program of the control unit 30.

The operation unit 34 is a user interface, such as a keyboard and a pointing device, capable of input and output with the control unit 30 or a voice input unit. A touch panel of the display unit 33 or a physical button provided in the housing may be used for the operation unit 34. The operation unit 34 notifies information of operation by the user to the control unit 20.

The configuration of the server apparatus 2 will be described later.

Figure 3:
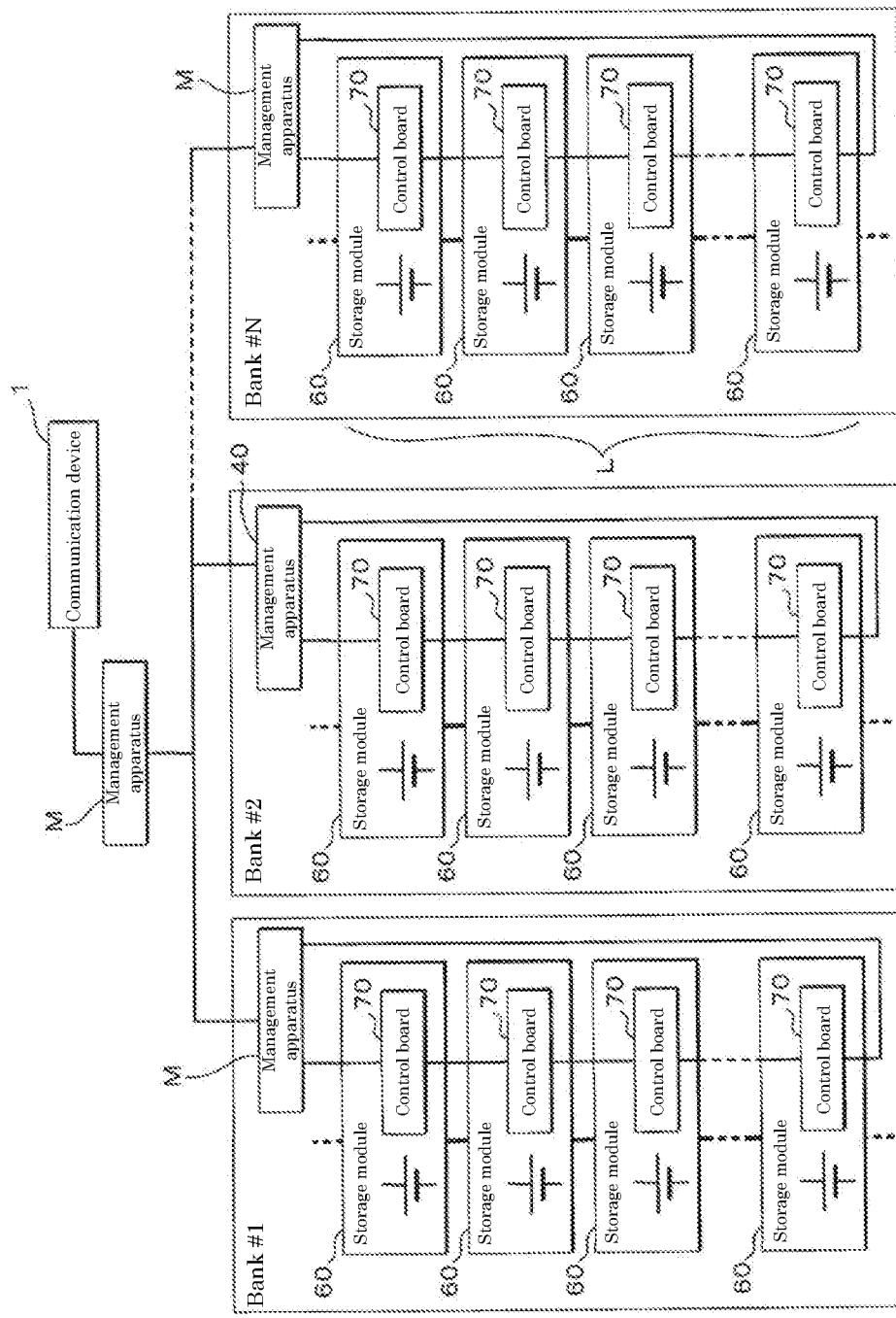
FIG. 3 is a diagram showing an example of a connection mode of a communication device.

FIG. 3 is a diagram showing an example of the connection mode of the communication device 1. As shown in FIG. 3, the communication device 1 is connected to the management apparatus M. Management apparatuses M provided in banks #1 to #N, respectively, are connected to the management apparatus M. Note that the communication device 1 may be a terminal apparatus (measurement monitor) that communicates with the management apparatuses M provided in each of the banks #1 to #N to receive information on the energy storage devices, or may be a network card type communication device that can be connected to a power-supply-related apparatus.

Each of the banks #1 to #N includes a plurality of energy storage modules 60, and each energy storage module 60 comprises a control board (cell monitoring unit: CMU) 70. The management apparatus M provided for each bank can communicate with the control board 70 with a communication function built in each energy storage module 60 by serial communication and can transmit and receive information to and from the management apparatus M connected to a communication device 1. The management apparatus M connected to the communication device 1 aggregates information from each management apparatus M of the bank belonging to a domain and outputs the aggregated information to the communication device 1.

Figure 4:
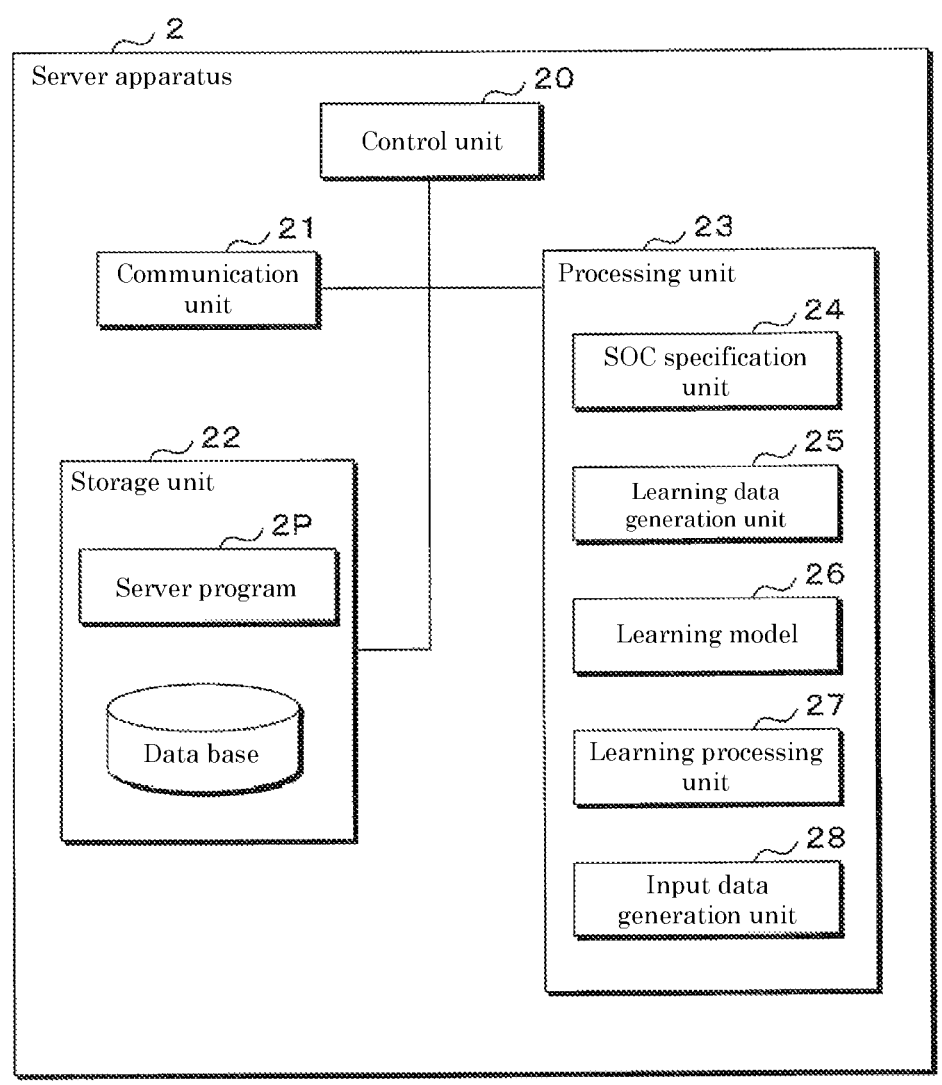
FIG. 4 is a block diagram showing an example of a configuration of a server apparatus.

FIG. 4 is a block diagram showing an example of the configuration of the server apparatus 2. The server apparatus 2 includes a control unit 20, a communication unit 21, a storage unit 22, and a processing unit 23. The processing unit 23 includes a SOC specification unit 24, a learning data generation unit 25, a learning model 26, a learning processing unit 27, and an input data generation unit 28. The server apparatus 2 may be a single server computer, but is not limited to this, and may be made up of a plurality of server computers. Note that the server apparatus 2 may be a simulator.

The control unit 20 can be made of, for example, a CPU, and controls the entire server apparatus 2 by using built-in memories such as ROM and RAM. The control unit 20 executes information processing based on a server program 2P stored in the storage unit 22. The server program 2P includes a Web server program, and the control unit 20 functions as a Web server that performs provision of a Web page to the client apparatus 3, reception of a login to a Web service, and the like. The control unit 20 can also collect information from the communication device 1 as a simple network management protocol) (SNMP) server based on the server program 2P.

The communication unit 21 is a communication device that achieves the communication connection and the transmission and reception of data via the network N. Specifically, the communication unit 21 is a network card corresponding to the network N.

The storage unit 22 may be a nonvolatile memory such as a hard disk or a flash memory. The storage unit 22 stores sensor information (e.g., voltage data, current data, and temperature data of the energy storage device) that includes the states of the target apparatuses P, U, D, M to be monitored and is collected by the processing of the control unit 20.

The processing unit 23 can acquire sensor information (voltage data in time series, current data in time series, temperature data in time series) of the energy storage devices (energy storage modules, energy storage cells) collected in the database of the storage unit 22, by classifying the information into each energy storage device.

The processing unit 23 operates in a learning mode for causing the learning model 26 to learn and an estimation mode for estimating a state of health (SOH) (estimating degradation) of the energy storage device by using the learning-completed learning model 26. The SOH is an index comparing a full charge capacity at present with a full charge capacity of a new product at a predetermined temperature. For example, a SOH of 80% means a capacity of only 80% of that of a new product. Alternatively, instead of the capacity, the amount of electric power that can be charged and discharged may be used as a reference. In general, when the SOH becomes smaller than a threshold value, the energy storage device reaches its life and is determined to be not usable.

Figure 5:
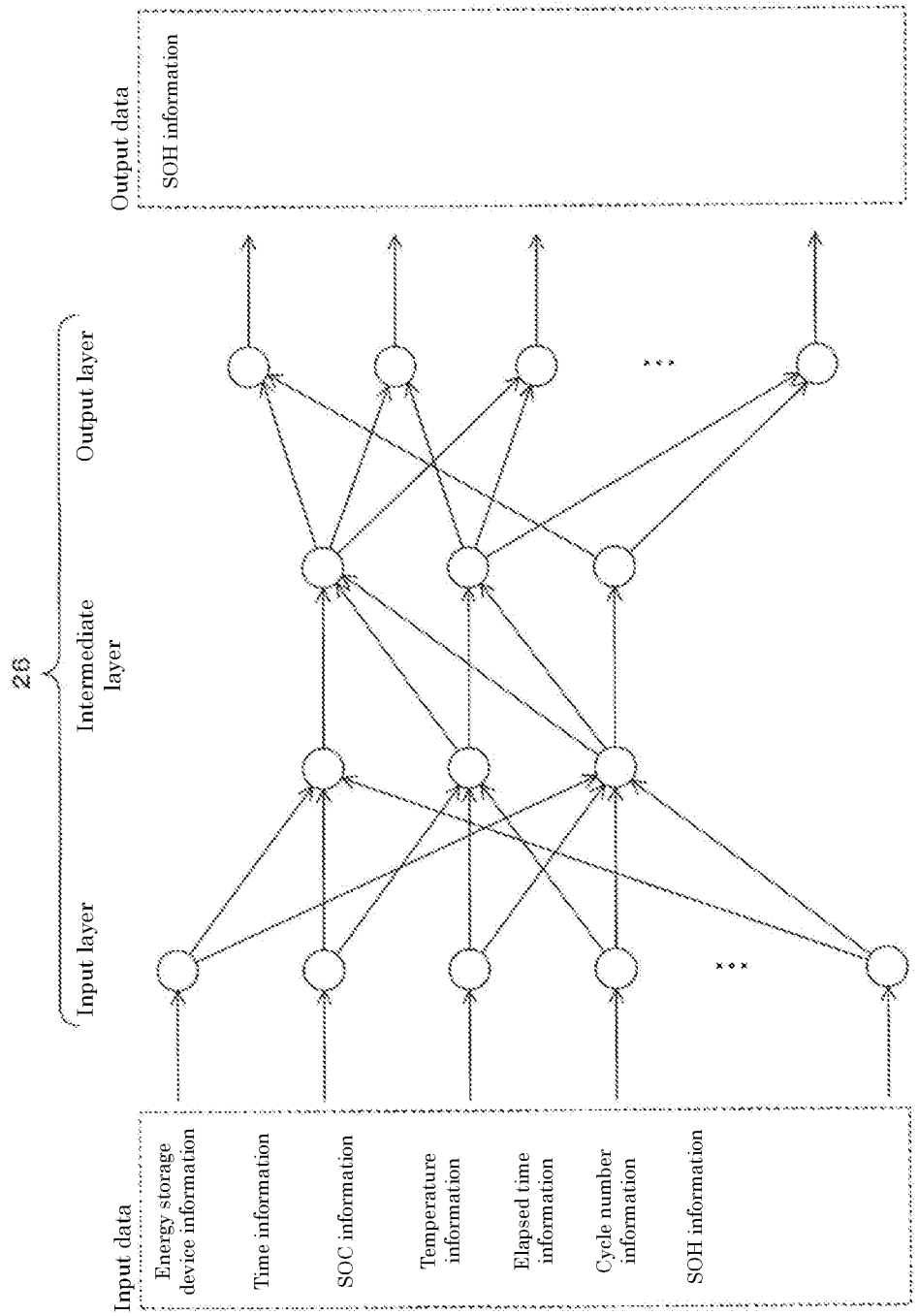
FIG. 5 is a schematic diagram showing an example of a configuration of a learning model.

FIG. 5 is a schematic diagram showing an example of the configuration of the learning model 26. The learning model 26 is a neural network model including deep learning and is made up of an input layer, an output layer, and a plurality of intermediate layers. Although two intermediate layers are shown in FIG. 5 for convenience, the number of intermediate layers is not limited to two but may be three or more.

In the input layer, the output layer, and the intermediate layer, there are one or more nodes (neurons), and the node of each layer is coupled in one direction with a desired weight to each of the nodes existing in the preceding and succeeding layers. A vector having the same number of components as the number of nodes of an input layer is provided as input data of the learning model 26 (input data for learning and input data for SOH estimation). The input data contains energy storage device information, time information, SOC information, temperature information, elapsed time information, cycle number information, SOH information, and the like. The output data includes SOH information. Details of these information will be described later. Of the input data, particularly the SOC information can be said to be the most important data. This is because the degradation of the energy storage device is considered to be most affected by the change in SOC, and the accuracy of the degradation determination can be improved by causing the learning model 26 to learn using the SOC information. That is, it can be said that the SOC information can express the state of the energy storage device more correctly than the other information. Another reason is that when the energy storage device discharges in a state where the SOC is high (big), it is difficult to express the state of the energy storage device based on the change in voltage. Particularly, the SOC information and the temperature information are related to each other, and local variations in the SOC information and the temperature information are related to a change in SOH, so that it is desirable to use convolutional neural networks in which a convolutional layer and a pooling layer that reflect those changes are added to an intermediate layer.

The data provided to each node of the input layer is input into the first intermediate layer, where the output of the intermediate layer is calculated using weights and activation functions, and the calculated values are provided to the next intermediate layer and are similarly transferred to subsequent layers (lower layer) in sequence until the output of the output layer is obtained in the same manner. Note that all the weights combining the nodes are calculated by a learning algorithm.

The output layer of the learning model 26 generates SOH information as output data. The output data can be data in a vector format having components of the same size as the number of nodes (size of the output layer) of the output layer. For example, when the SOH of the energy storage device is output every 1% from 0% to 100%, the number of nodes of the output layer can be set to 101. As practical SOH information, for example, when the SOH is estimated every 1% between 60% and 100%, the number of nodes of the output layer may be set to 41. In addition, a SOH value may be divided at intervals of several percent, and output data may be output at intervals of several percent. Note that the output value from the output layer can be interpreted as the probability of being classified into each segment of the SOH.

The learning model 26 and the learning processing unit 27 can be configured, for example, by combining hardware such as a CPU (e.g., multiple processors mounted with a plurality of processor cores, etc.), a graphics processing unit (GPU), a digital signal processor (DSP), a field-programmable gate array (FPGA), and the like. A quantum processor can also be combined. The learning model 26 is not limited to a neural network model but may be other machine learning models.

Figure 6:
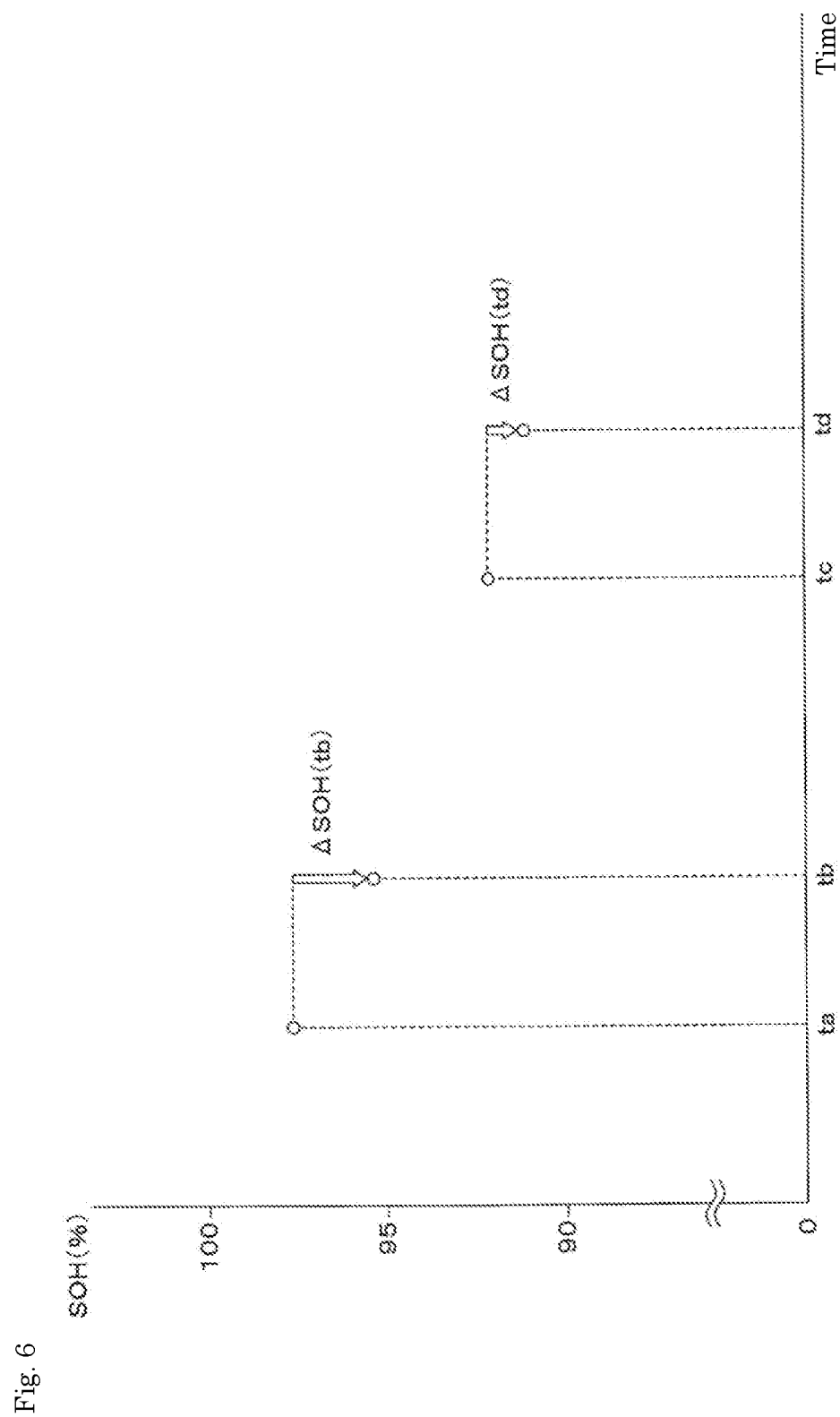
FIG. 6 is a schematic diagram showing an example of a decrease in SOH in accordance with the use time of the energy storage device.

FIG. 6 is a schematic diagram showing an example of a decrease in SOH in accordance with the use time of the energy storage device. In the figure, the vertical axis indicates the SOH (%), and the horizontal axis indicates the time. The SOH of the energy storage device decreases with the use time (including the standing time). As shown in FIG. 6, time points ta, tb, tc, and td are set, and the time points tb and ta are set to be the same as the time points td and tc. In this case, a SOH decrease ΔSOH from the time point ta to the time point tb (tb) differs from a SOH decrease ΔSOH from the time point tc to the time point td (td). As described above, even in the same use period, the degree of decrease in SOH differs depending on the use state of the energy storage device. Therefore, for specifying various use states of the energy storage device, grasping the use states of the energy storage device between two different time points is important in order to estimate the SOH of the energy storage device.

Figure 7:
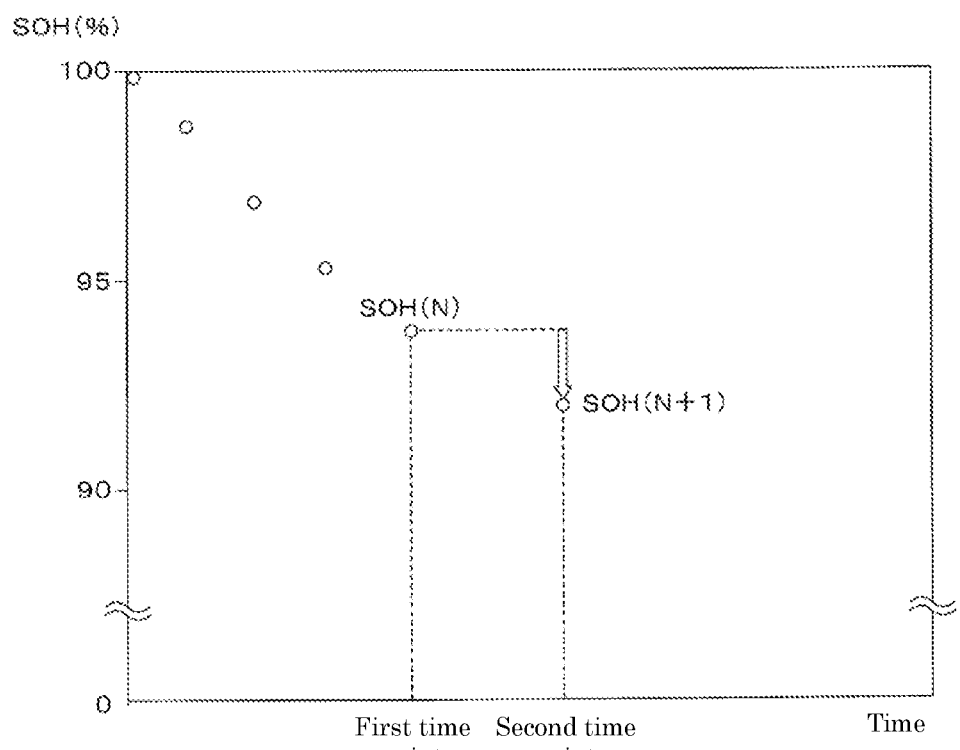
FIG. 7 is a schematic diagram showing an example of a decrease in the SOH of the energy storage device at each of the first and second time points.

FIG. 7 is a schematic diagram showing an example of a decrease in the SOH of the energy storage device at the first and second time points. The SOH at the first time point is represented by SOH(N), and the SOH at the second time point is represented by SOH(N+1). The decrease in SOH {SOH(N)−SOH(N+1)} at the second time point differs depending not only on the SOH(N) at the first time point but also on the use state of the energy storage device from the first time point to the second time point. In other words, by specifying the SOH(N) of the energy storage device at the first time point, the SOH(N+1) of the energy storage device at the second time point can be estimated when the use state of the energy storage device from the first time point to the second time point is known.

In the following, first, the learning mode of the learning model 26 will be described.

The processing unit 23 has a function as a SOH acquisition unit and acquires the SOH of the energy storage device at the first time point and the SOH at the second time point after the first time point. The energy storage device may be, for example, an energy storage device actually operating in a mobile body or facility. The SOH can be estimated by a known method based on the sensor information. Alternatively, the SOH may be estimated using a method described in Japanese Patent Application No. 2017-065532 (its entire contents are incorporated herein by reference). The period between the first time point and the second time point can be appropriately set and may be, for example, one month or three months. When the sensor information has periodicity, the period between the first time point and the second time point may be divided by the cycle of the sensor information. At that time, an interpolation value at the first and second time points may be used for the SOH. The SOH at the first time point may be a value estimated by the learning-completed learning model 26 based on the SOH at a time point before the first time point. Hence, it is possible to continuously estimate in any period the SOH of the energy storage device in the use period (including a standing period) after the manufacturing of the energy storage device.

The processing unit 23 specifies time-series data relating to the state (e.g., use state) of the energy storage device from the first time point to the second time point. The degree to which the SOH at the second time point has been lower than the SOH at the first time point (degradation is progressing) depends on a use state of the energy storage device from the first time point to the second time point. The processing unit 23 specifies the time-series data relating to the state of the energy storage device from sensor information of the energy storage device.

The learning data generation unit 25 generates learning data with the SOH at the first time point and the time-series data from the first time point to the second time point as input data and with the SOH at the second time point as output data.

The learning processing unit 27 causes the learning model 26 to learn based on the learning data generated by the learning data generation unit 25. For example, the SOH at the first time point is represented by SOH(N), and the SOH at the second time point is represented by SOH(N+1).

The learning data generation unit 25 need not be provided in the server apparatus 2 but may be provided in another server apparatus so that the learning data generated in the server apparatus may be acquired, and the learning processing unit 27 may cause the learning model 26 to learn based on the acquired learning data. The same applies to the following description of the present specification.

The learning model 26 learns that the SOH at the first time point is SOH(N) and how the state of the energy storage device from the first time point to the second time point transitions to make the SOH at the second time point become SOH(N+1) Such learning data can be collected in large quantities from sensor information of many energy storage devices operating in a mobile body or facility. As described below, when the SOH at a certain time point (e.g., at present)

and the use condition of the energy storage device from time point to a prediction target point after a degradation estimation period are input (e.g., one month, three months, or the like from the present) to the learning-completed learning model 26, the SOH at the prediction target point can be estimated. Thus, the degradation of the energy storage device in the future (e.g., one month later, three months later, etc.) can be estimated using the AI.

Next, as an example of the time-series data, time-series data relating to a state of charge (SOC) will be described.

Figure 8:
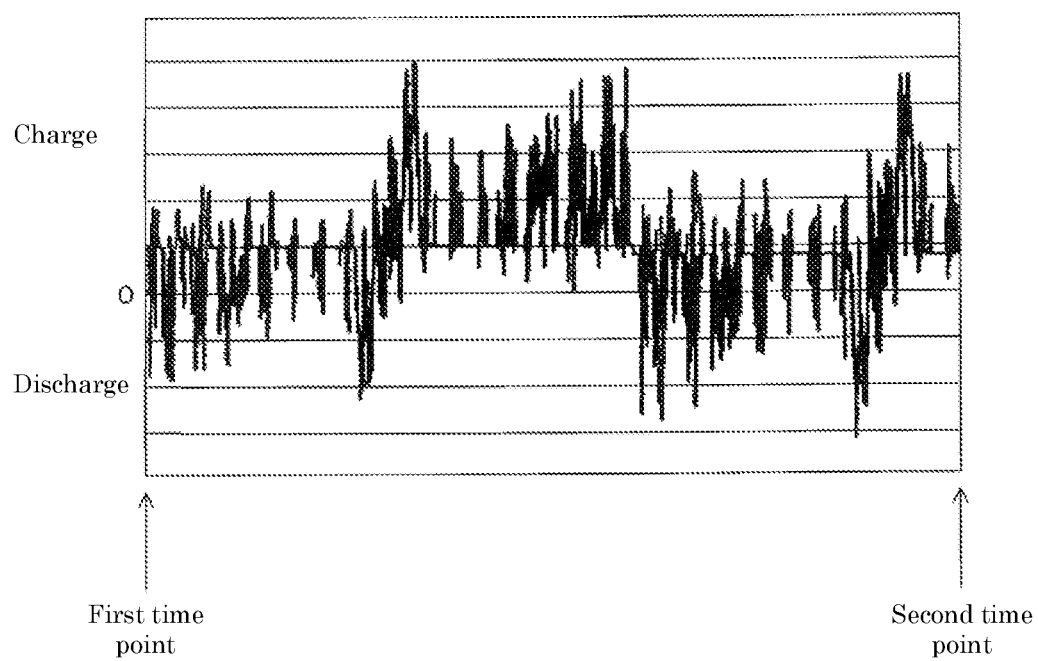
FIG. 8 is a schematic diagram showing an example of a current waveform from the first time point to the second time point.

FIG. 8 is a schematic diagram showing an example of a current waveform from the first time point to the second time point. In the figure, the vertical axis indicates the current, the positive side indicates the charge, and the negative side indicates the discharge. The horizontal axis indicates the time. As shown in FIG. 8, time-series current data can be collected from each of the energy storage devices (energy storage cells).

Figure 9:
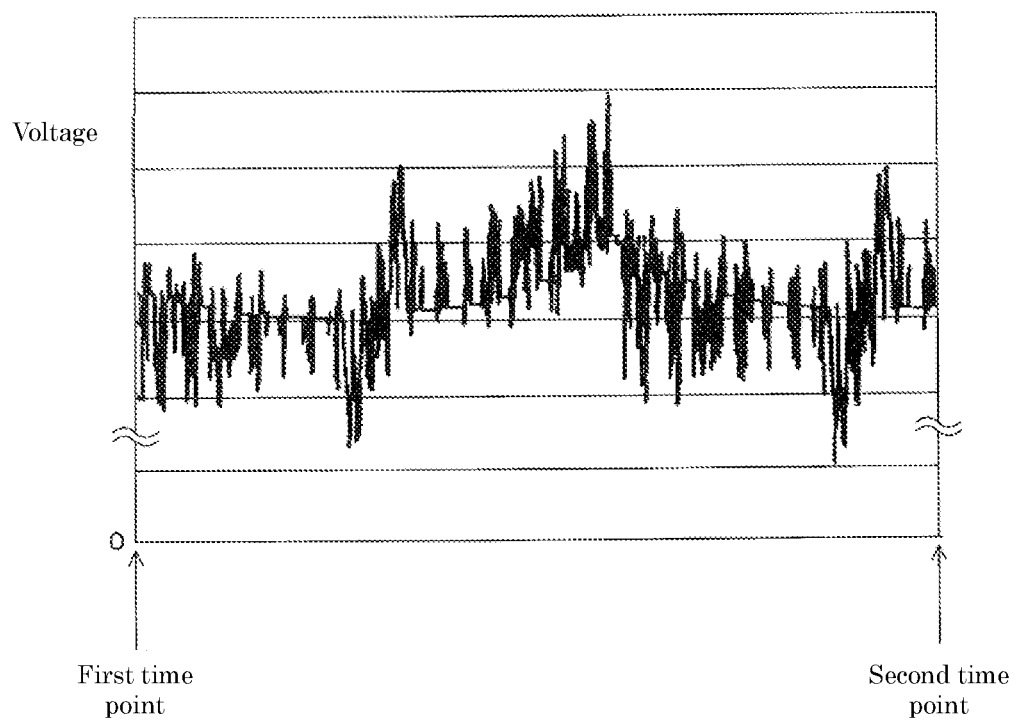
FIG. 9 is a schematic diagram showing an example of a voltage waveform from the first time point to the second time point.

FIG. 9 is a schematic diagram showing an example of a voltage waveform from the first time point to the second time point. In the figure, the vertical axis indicates the voltage, and the horizontal axis indicates the time. As shown in FIG. 9, time-series voltage data can be collected from each of the energy storage devices (energy storage cells).

Figure 10:
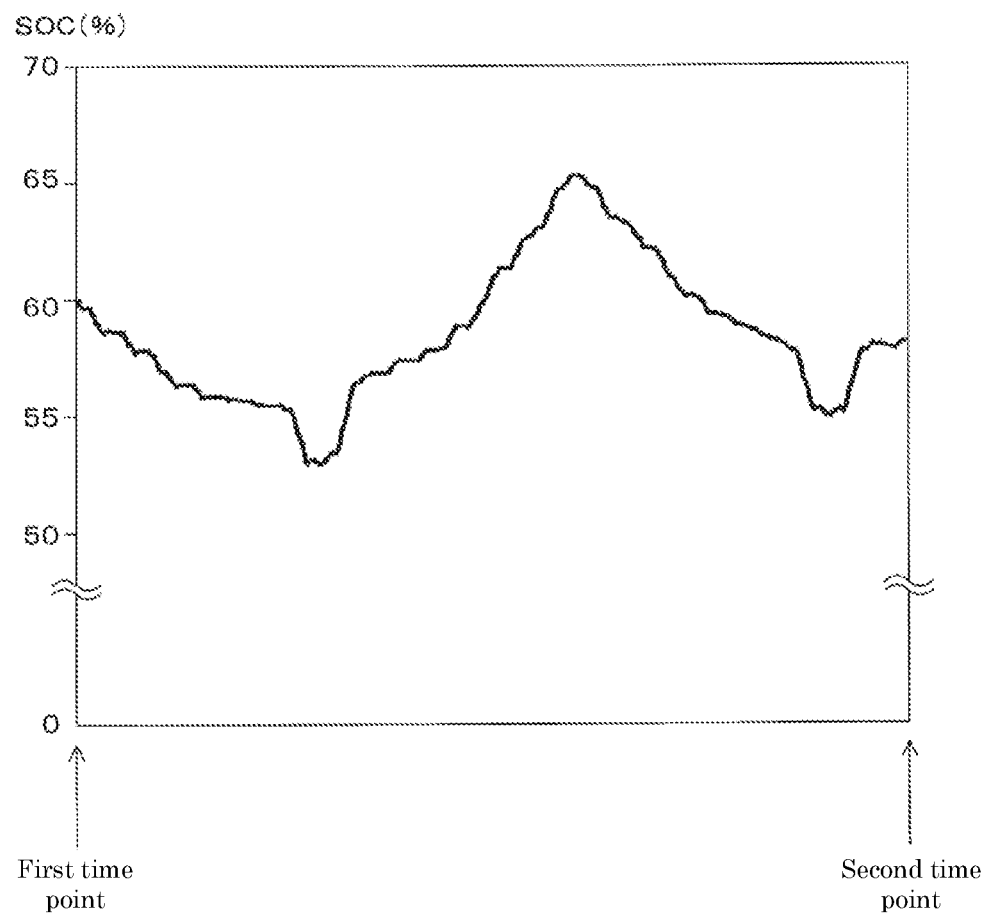
FIG. 10 is a schematic diagram showing an example of SOC data from the first time point to the second time point.

FIG. 10 is a schematic diagram showing an example of SOC data from the first time point to the second time point. In the figure, the vertical axis indicates the SOC, and the horizontal axis indicates the time. The SOC specification unit 24 can specify the time-series data relating to the SOC of the energy storage device based on the time-series current data of the energy storage device, as shown in FIG. 8. The time-series data relating to the SOC can be obtained, for example, by the current integration method. Note that the SOC specification unit 24 need not be included in the server apparatus 2 but may be included in another server apparatus so that the time-series data relating to the SOC of the energy storage device specified by the server apparatus may be acquired, and the learning processing unit 27 may cause the learning model 26 to learn based on the acquired time-series data.

The learning data generation unit can generate learning data with the SOH at the first time point and the time-series data relating to the SOC as input data and with the SOH at the second time point as output data.

In the energy storage device (e.g., lithium ion battery), a solid electrolyte interface layer (SEI layer) is generated at an interface between an electrode and an electrolyte solution by charging and discharging or standing, and the SOH decreases as the SEI layer grows. Based on the hypothesis that the growth of the SEI layer depends on the SOC, the inventors of the present invention have proposed to cause a learning model 26 to learn using time-series data of how the SOC of the energy storage device has transitioned over time. Thus, a learning-completed learning model 26 capable of accurately estimating SOH can be generated.

Figure 11:
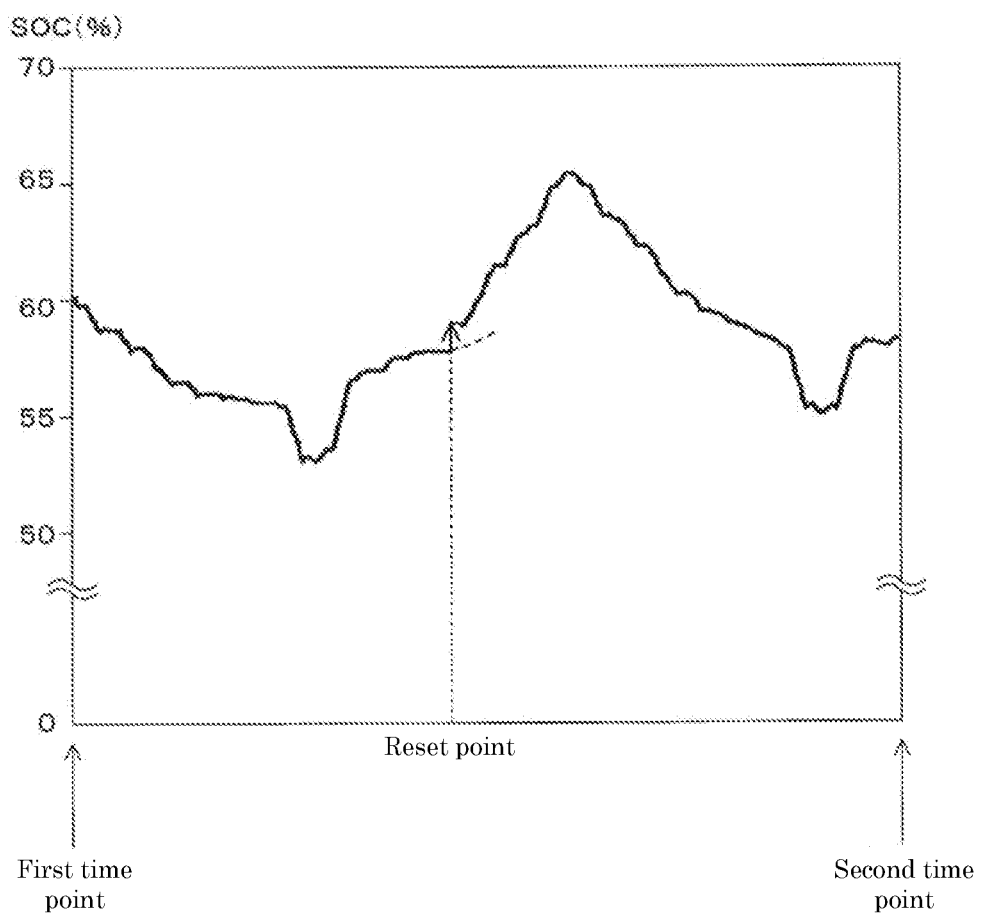
FIG. 11 is a schematic diagram showing an example of SOC data subjected to SOC reset.

FIG. 11 is a schematic diagram showing an example of SOC data subjected to SOC reset. The SOC specification unit 24 has a function as a correction unit and corrects data at a certain time point among the specified time-series data relating to the SOC based on the voltage data.

For example, an open-circuit voltage (OCV) of the energy storage device can be acquired based on voltage data at a time point (a reset point in FIG. 11) when the charge or discharge of the energy storage has been ended and the voltage after the elapse of the certain time is stable. The SOC can be obtained from the SOC-OCV characteristic and the obtained OCV. When the difference between the SOC obtained from the OCV and the SOC calculated by the current integration method is not less than a predetermined value, the SOC calculated by the current integration method is replaced with the SOC obtained from the OCV to reset an error by the current integration method, thereby obtaining the SOC with high accuracy.

The processing unit 23 has a function as an erasing unit and erases the current data from the first time point to the second time point among the current data stored in the storage unit 22 when the learning model 26 is caused to learn based on the time-series data relating to the SOC from the first time point to the second time point. For example, when the SOC specification unit 24 specifies the time-series data relating to the SOC from the first time point to the second time point, the processing unit 23 can erase the current data from the first time point to the second time point among the current data stored in the storage unit 22.

Once the time-series data relating to the SOC from the first time point to the second time point is specified based on the current data, the current data from the first time point to the second time point becomes unnecessary. By erasing the current data from the first time point to the second time point, the storage capacity of the storage unit 22 can be reduced. In addition, since other current data can be stored in vacant storage capacity by the erasing, a large amount of sensor information can be stored. When the current data is erased, the previous sensor information may be compressed and held as previous history, and the previous history may be reflected by inputting the previous history to the learning model 26.

Figure 12:
FIG. 12 is a schematic diagram showing an example of temperature data from the first time point to the second time point.

FIG. 12 is a schematic diagram showing an example of temperature data from the first time point to the second time point. In the figure, the vertical axis indicates the temperature, and the horizontal axis indicates the time. As shown in FIG. 12, time-series temperature data can be collected from each of the energy storage devices (energy storage cells).

The learning data generation unit 25 can generate learning data with the time-series data relating to the temperature data of the energy storage device from the first time point to the second time point as input data. The decrease in the SOH of the energy storage device depends on the temperature of the energy storage device. Therefore, by causing the learning model 26 to learn using the time-series data of how the temperature of the energy storage device has transitioned over time, it is possible to generate a learning-completed learning model 26 that can accurately estimate the SOH.

FIG. 13 is a block diagram showing an example of data for learning. In the example of FIG. 13, the first time point is defined as time t1, and the second time point is defined as time point t90. Assuming that the period from the first time point to the second time point is three months, the time interval may be one day. Here, the time (time information) can be a numeric value or a character string indicating a time point or a time zone to be uniquely determined. The time information (t1, t2, . . . ) may be a time relative to the first time point, a time based on the point of manufacturing the energy storage device, or a time based on a specific time point (e.g., at 0:00:00 on Jan. 1, 2017).

As shown in FIG. 13, the input data for learning can be ninety SOC values from time t1 to time point t90, ninety temperature values from time t1 to time point t90, and SOHt1 at time t1. The output data for learning may be SOHt90 at time point t90.

FIG. 14 is a block diagram showing another example of the data for learning. The difference from the example of FIG. 13 is that the input data for learning may further include an elapsed time Dt1 from the point of manufacturing (e.g., the point of completion of manufacturing) to time t1, and a cycle number Ct1 from the point of manufacturing (e.g., the point of completion of manufacturing) to time t1.

The learning data generation unit 25 can generate learning data with the elapsed period from the point of manufacturing the energy storage device to the first time point as input data. The SOH of the energy storage device decreases with the standing time (calendar degradation). The decrease in SOH after the first time point is considered to depend on the length of time elapsed from the point of manufacturing (e.g., the point of completion of manufacturing) to the first time point. Therefore, by further generating learning data with the elapsed period from the point of manufacturing the energy storage device to the first time point as input data, it is possible to generate a learning-completed learning model 26 that can accurately estimate the SOH.

The learning data generation unit 25 can generate learning data with a total energized electricity amount (e.g., a cycle number when the cycle number can be specified) from the point of manufacturing the energy storage device to the first time point as input data. The SOH of the energy storage device decreases with the cycle number (cycle degradation). The decrease in SOH after the first time point is considered to depend somewhat on the cycle number from the point of manufacturing (e.g., the point of completion of manufacturing) to the first time point. Therefore, when the cycle number can be specified, by further generating learning data with the cycle number from the point of manufacturing the energy storage device to the first time point as input data, a learning-completed learning model 26 capable of accurately estimating SOH can be generated. Note that the learning data may be generated using only either the elapsed time Dt1 or the cycle number Ct1. When it is not possible to specify the cycle number, the total amount of energized electricity may be used instead of the cycle number.

In the example described above, the example of setting only one learning period from the first time point to the second time point has been described, but the invention is not limited thereto.

Figure 15:
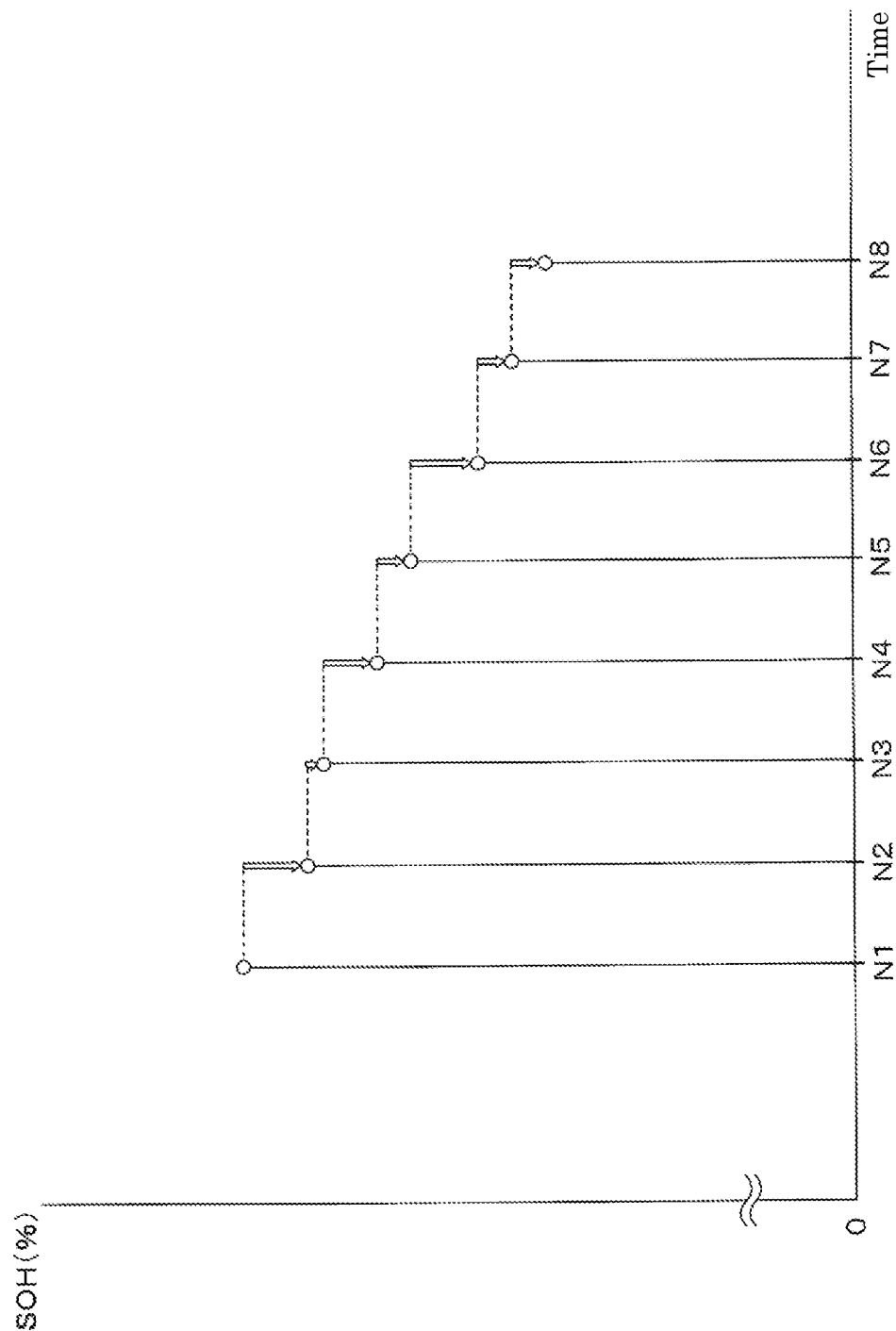
FIG. 15 is a schematic diagram showing an example in which a plurality of learning periods are set.

FIG. 15 is a schematic diagram showing an example in which a plurality of learning periods are set. In the figure, the vertical axis indicates the SOH, and the horizontal axis indicates the time. As shown in FIG. 15, time point N1, time point N2, time point N3, time point N4, time point N5, time point N6, time point N7, and time point N8 are set. The time between adjacent time points may be different. A learning period can be set with the time point N1 as the first time point and the time point N2 as the second time point. Also, a learning period can be set with the time point N2 as the first time point and the time point N3 as the second time point. The same applies hereinafter.

As shown in FIG. 15, the learning data generation unit 25 can generate learning data by providing a plurality of learning periods from the first time point to the second time point over the use period of the energy storage device. Assuming that the learning period from the first time point to the second time point is ΔN, it is possible to estimate a SOH at a certain time point after the manufacturing of the energy storage device to reach the life by causing the learning model 26 to learn using data for learning for each of the plurality of learning periods ΔN over the use period from the point of manufacturing to the life of the energy storage device, for example. That is, the life of the energy storage device can be predicted.

Next, the estimation mode for estimating the SOH will be described.

FIG. 16 is a block diagram showing an example of input data for life estimation. As shown in FIG. 16, the input data for life estimation may be ninety SOC values from time te1 (e.g., at present) to time te90, ninety temperature values from time te1 to time te90, and SOHte1 at time te1.

The input data generation unit 28 generates input data for life estimation based on the SOH at the first time point and time-series data relating to the state (e.g., use state) of the energy storage device from the first time point to the second time point. SOHte1 at the first time point (time te1 in FIG. 16) may be estimated by a known method based on the sensor information, or a value estimated by the learning-completed learning model 26 may be used. For example, as SOHte1 at the first time point, a value estimated by the learning-completed learning model 26 based on the SOH at a time point before the first time point can also be used. Thus, the SOH can be continuously estimated in any period. The second time point is a prediction target point at which the SOH is estimated. The time-series data relating to the state of the energy storage device (the time-series data relating to the SOC in FIG. 16) can be specified from the scheduled use condition of the energy storage device from the first time point to the second time point.

The learning-completed learning model 26 estimates the SOH at the second time point with the SOH at the first time point and the time-series data as input data. Thus, when the SOH at the first time point (e.g., at present) and the scheduled use condition of the energy storage device from the first time point to the second time point (prediction target point) are known, the SOH at the second time point can be estimated. By using the SOH at the first time point, it is also possible to determine, based on the first time point, how to set the scheduled use condition of the energy storage device from the first time point to the second time point to make the SOH at the second time point larger (prevent a decrease in SOH).

FIG. 17 is a block diagram showing another example of the input data for life estimation. As the difference from the example of FIG. 16, the input data further contains an elapsed time Dte1 from the point of manufacturing (e.g., the point of completion of manufacturing) to time te1 and a cycle number Cte1 from the point of manufacturing (e.g., the point of completion of manufacturing) to time te1.

Figure 18:
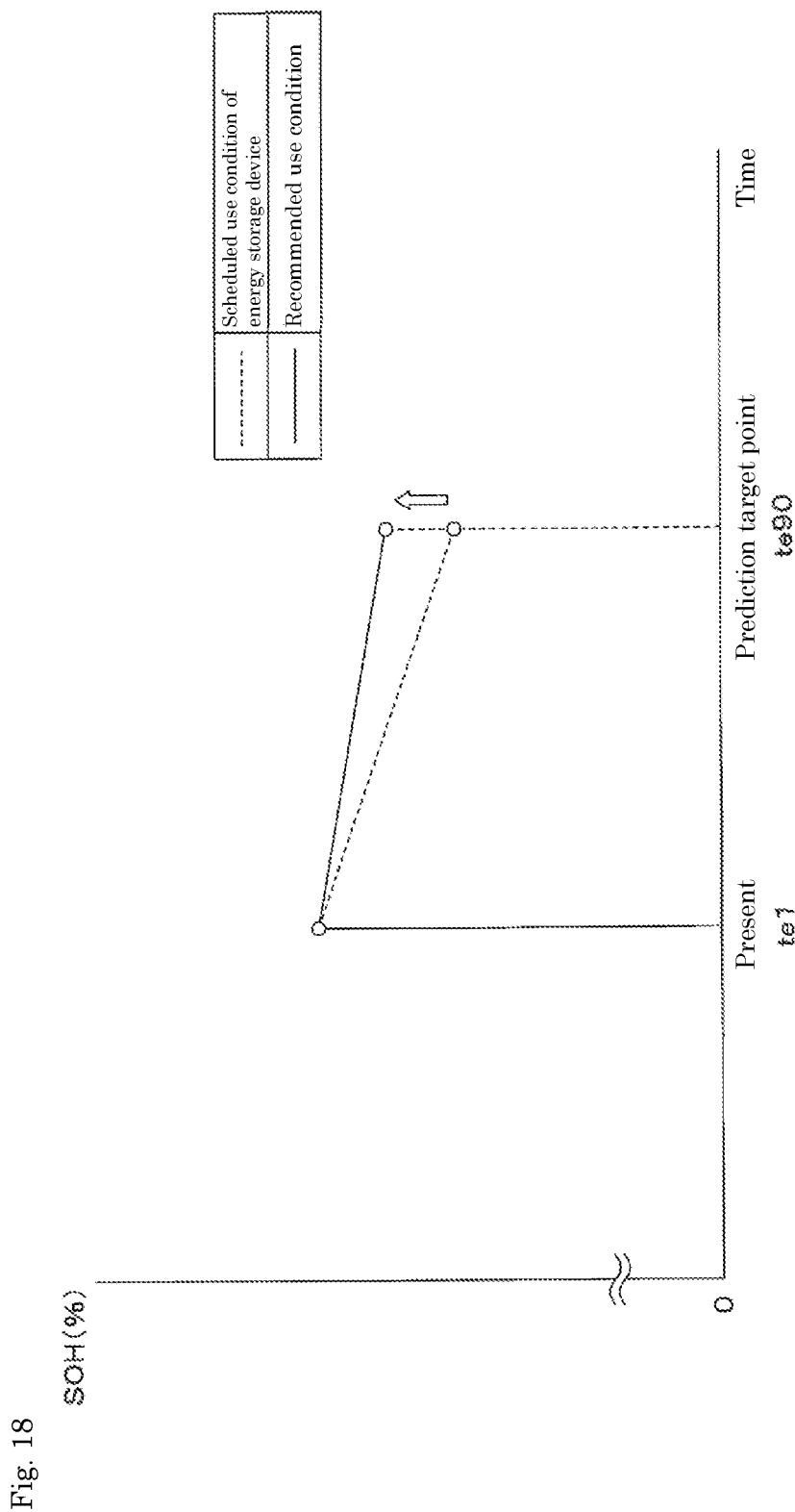
FIG. 18 is a schematic diagram showing an example of the degradation estimation result of the energy storage device.

FIG. 18 is a schematic diagram showing an example of the degradation estimation result of the energy storage device. In the figure, the vertical axis indicates the SOH, and the horizontal axis indicates the time. The learning-completed learning model 26 estimates a SOH at present (time te1) and a SOH from the present to the prediction target point (time te90). In FIG. 18, a curve indicated by a broken line shows a SOH transition in a scheduled use condition (e.g., the user's scheduled use state) from the present to the prediction target point of the energy storage device. According to the server apparatus 2 of the present embodiment, the SOH can be estimated by changing the use condition of the energy storage device from the present to the prediction target point. For example, as shown by a curve indicated by a solid line, a use condition (recommended use condition) that can prevent a decrease in SOH at the prediction target point can be found. By using the SOH at present (time te1), that is, the SOH at the first time point, it is possible to provide information on how to set the use condition of the energy storage device from the first time point to the second time point with reference to the first time point to enable prevention of a decrease in SOH.

Figure 19:
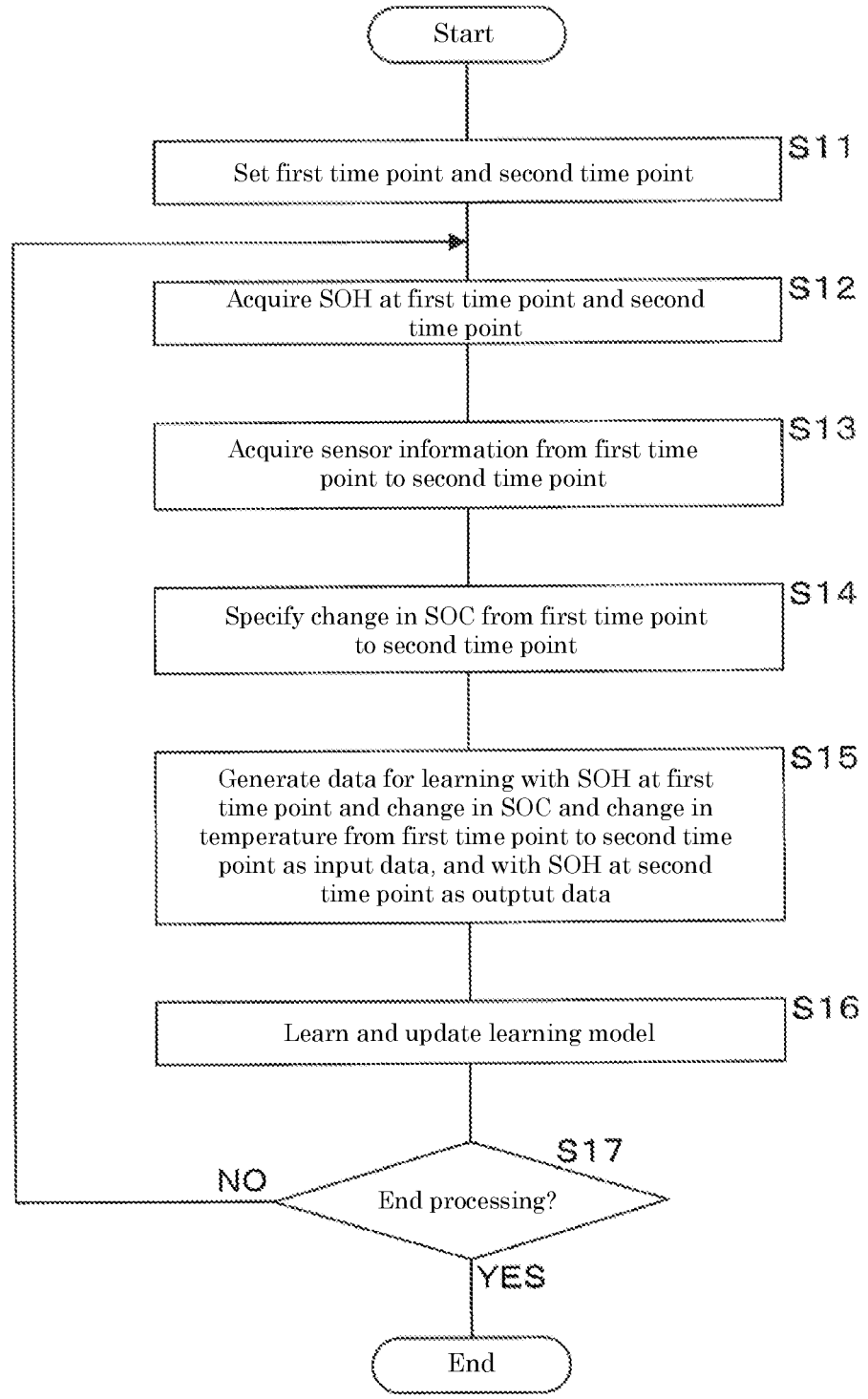
FIG. 19 is a flowchart showing an example of a processing procedure of a processing unit in a learning mode.

FIG. 19 is a flowchart showing an example of the processing procedure of the processing unit 23 in the learning mode. The processing unit 23 sets the first and second time points (S11) and acquires SOHs at the first and second time points (S12). The processing unit 23 acquires sensor information (time-series current data, time-series temperature data, time-series voltage data) from the first time point to the second time point (S13).

The processing unit 23 specifies the SOC transition from the first time point to the second time point based on the acquired sensor information (S14) and generates data for learning with the SOH at the first time point, the SOC transition from the first time point to the second time point, and the temperature transition from the first time point to the second time point as input data and with the SOH at the second time point as output data (S15).

The processing unit 23 performs the learning and update of the learning model 26 based on the generated data for learning (S16) and determines whether or not to end the processing (S17). When it is determined that the processing is not to be completed (NO in S17), the processing unit 23 continues the processing from step S12, and when it is determined that the processing is to be completed (YES in step S17), the processing is completed.

Figure 20:
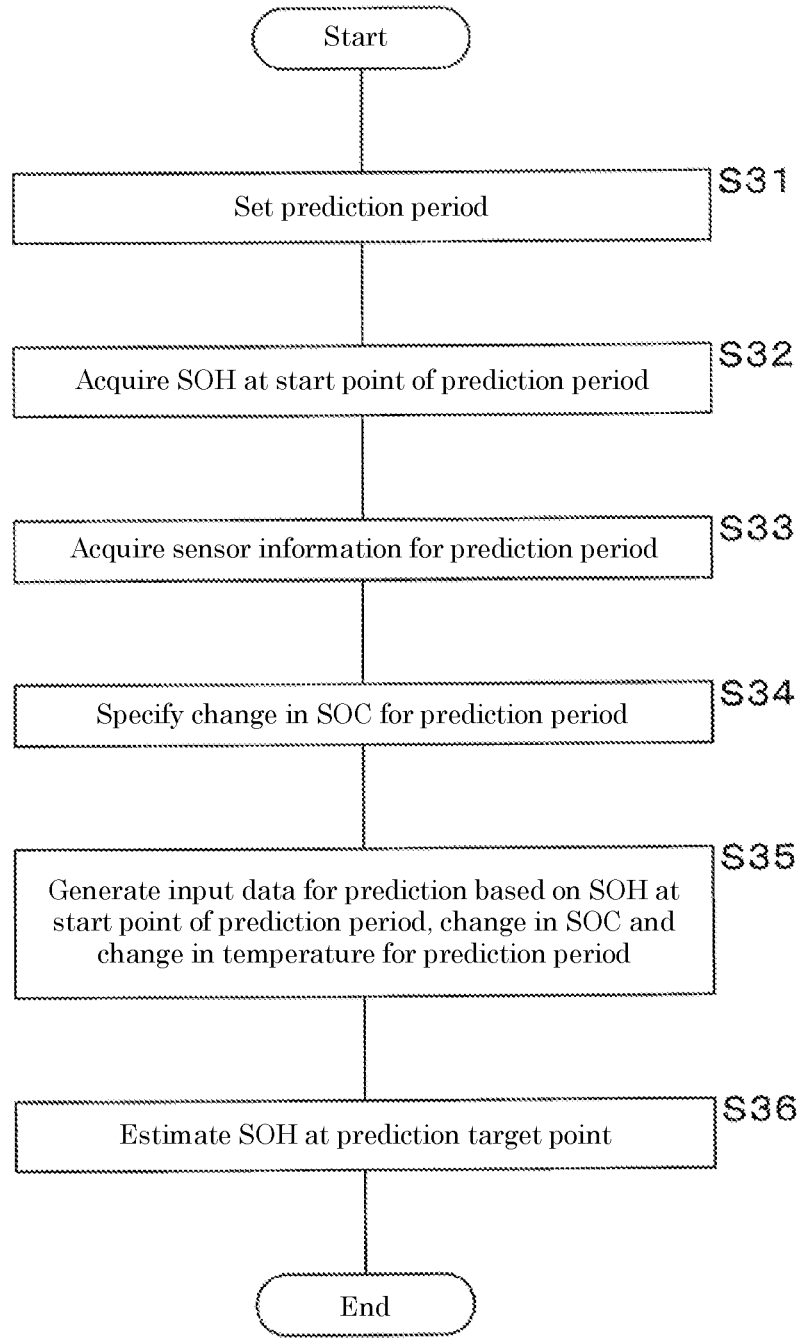
FIG. 20 is a flowchart showing an example of the processing procedure of the processing unit in the estimation mode.

FIG. 20 is a flowchart showing an example of the processing procedure of the processing unit 23 in the estimation mode. The processing unit 23 sets a prediction period (S31) and acquires SOH at the start point (the first time point) of the prediction period (S32). The processing unit 23 acquires sensor information in the prediction period (S33) and specifies the SOC transition in the prediction period based on the acquired sensor information (S34).

The processing unit 23 generates input data for prediction based on the SOH at the start point of the prediction period, the SOC transition in the prediction period, and the temperature transition in the prediction period (S35). The processing unit 23 estimates the SOH at the prediction target point (S36) and ends the processing.

As described above, according to the server apparatus 2 of the present embodiment, the learning model 26 can learn detailed behavior of the energy storage device in an actual use state based on a large amount of sensor information detected by a large number of energy storage devices operating in a mobile body or a facility, so that the SOH of the energy storage device can be estimated with higher accuracy than a conventional degradation estimation model (e.g., an estimation model based on parameters determined, for example, from endurance tests under simple conditions).

Further, since the detailed behavior of the energy storage device in the actual use state is learned in the learning mode, the correlation with the behavior of the energy storage device of the SOH estimation target operating in the mobile body or facility is favorable, and the reliability of the SOH estimation is high. Note that the energy storage device for learning is not limited to one actually operating. For example, it is also possible to use data of the energy storage device that is returned as being close to the end of its life or being degraded.

As described in the second embodiment, two-dimensional image data may be input as the SOC time-series data, which is input data. The processing unit 23 may include a two-dimensional image generation unit that generates two-dimensional image data, but the present invention is not limited thereto, and the two-dimensional image generation unit may be located outside the processing unit 23 (or server apparatus 2). That is, the degradation estimation apparatus need not include the two-dimensional image generation unit, and data of a two-dimensional image generated by another processing apparatus may be input to the degradation estimation apparatus.

Second Embodiment

In the first embodiment described above, the learning processing unit 27 (processing unit 23) has been configured to cause learning and update of the learning model 26, but in the second embodiment, the learning processing unit 27 (processing unit 23) can cause the learning model 26 to learn using the degradation value (SOH) of the energy storage device output by a degradation simulator to be described later as learning data and can cause the learning-completed learning model 26 to relearn using the same processing as in the first embodiment. The second embodiment will be described below.

Figure 21:
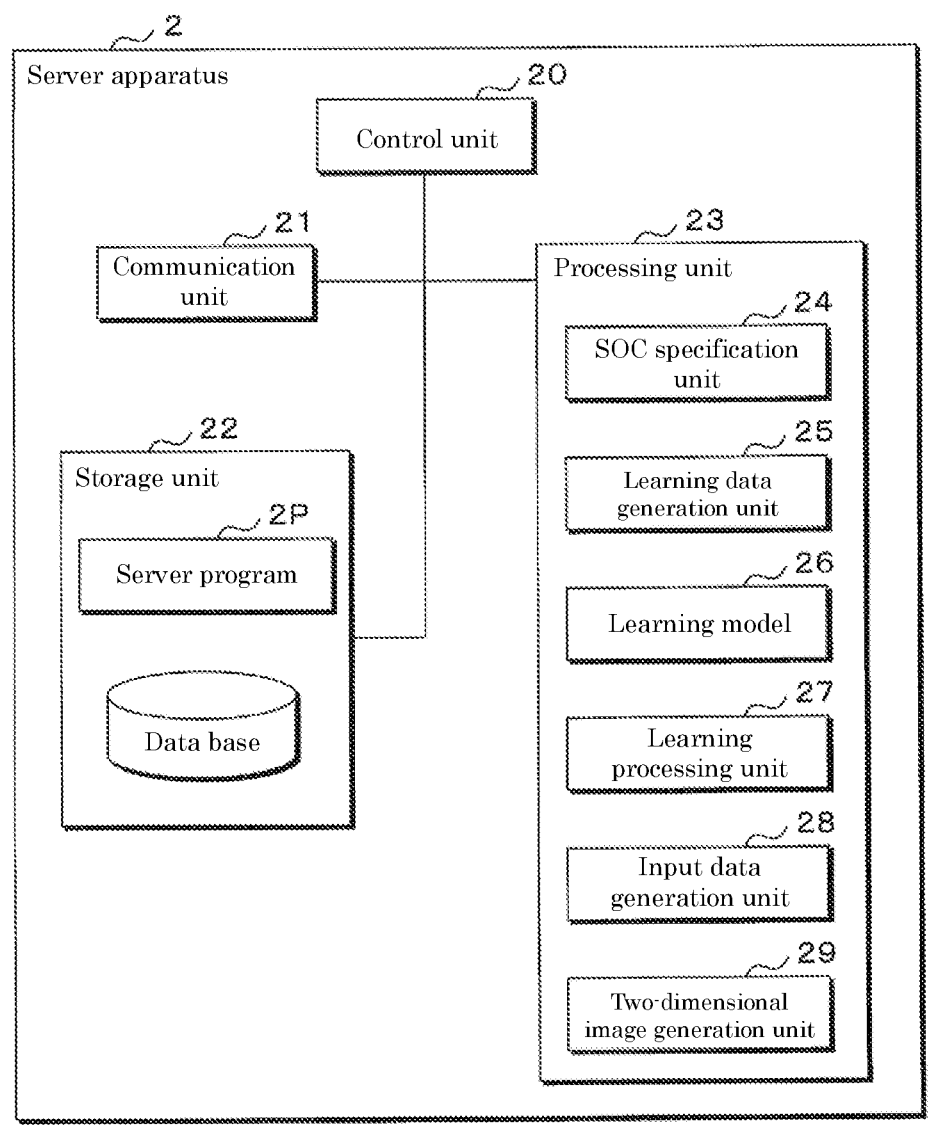
FIG. 21 is a block diagram showing an example of the configuration of the server apparatus of a second embodiment.

FIG. 21 is a block diagram showing an example of the configuration of the server apparatus 2 of a second embodiment. The second embodiment differs from the server apparatus 2 of the first embodiment shown in FIG. 4 in that a two-dimensional image generation unit 29 is provided. Note that details of the two-dimensional image generation unit 29 will be described later. Although the example where the two-dimensional image generation unit 29 is included in the processing unit 23 is shown in the present example, the present invention is not limited thereto, and the two-dimensional image generation unit 29 may be located outside the processing unit 23 (or server apparatus 2). That is, the degradation estimation apparatus need not include the two-dimensional image generation unit, and data of a two-dimensional image generated by another processing apparatus may be input to the degradation estimation apparatus.

Figure 22:
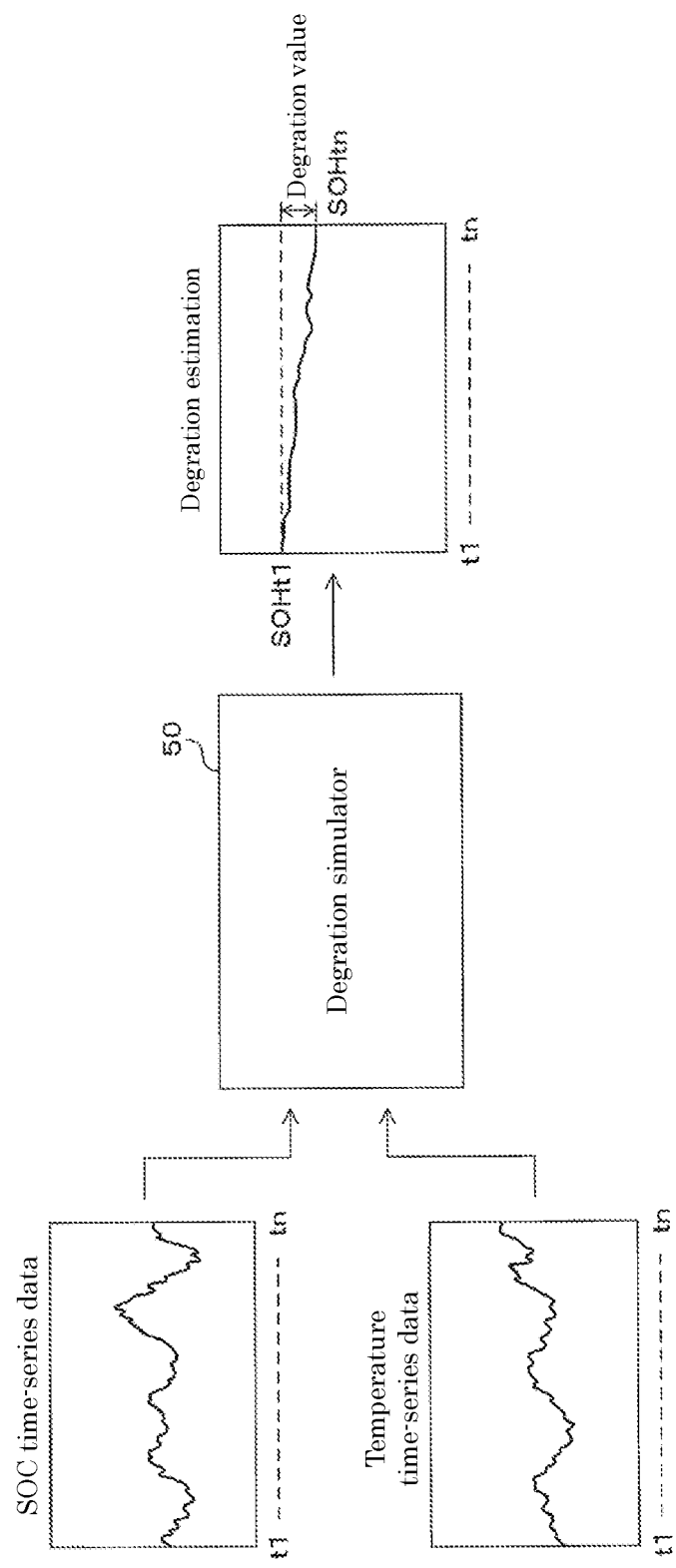
FIG. 22 is a schematic diagram showing the operation of a degradation simulator of the second embodiment.

FIG. 22 is a schematic diagram showing the operation of the degradation simulator 50 of the second embodiment. When acquiring SOC time-series data and temperature time-series data as input data, the degradation simulator 50 estimates (calculations) a degradation value of the energy storage device. As shown in FIG. 22, the SOC time-series data indicates variation in SOC (e.g., variation in n SOC values per time point) from time point t1 to time point tn, and the temperature time-series data indicates variation in temperature (e.g., variation in n temperature values per time point) from time point t1 to time point tn.

That is, the degradation simulator 50 can estimate a decrease (degradation value) of the SOH from time point t1 to time point tn based on variation in the SOC and the temperature from time point t1 to time point tn. Assuming that a SOH (also referred to as health) at time point t1 is SOHt1 and a SOH at time point tn is SOHtn, the degradation value becomes (SOHt–SOHtn). That is, when the SOH at time point t1 is known, the SOH at time point tn can be obtained based on the degradation value. Here, the time point may be a present or future time point, and the time point tn may be a time point at which a certain time has elapsed from the time point t1 toward the future. The time difference between the time point t1 and the time point tn is a degradation prediction target period of the degradation simulator 50 and can be appropriately set depending on a degree of future prediction of the degradation value. The time difference between the time point t1 and the time point tn can be a certain time, such as one month, half-year, one year, or two years.

In the example of FIG. 22, the temperature time-series data is input, but a required temperature (e.g., average temperature from time point t1 to time point tn) may be input instead of the temperature time-series data.

A degradation value Qdeg after the lapse of the degradation prediction target period (e.g., from time point t1 to time point tn) of the energy storage device can be calculated by a formula Qdeg=Qcnd+Qcur. Here, Qcnd is a non-energization degradation value and Qcur is an energization degradation value. The non-energization degradation value Qcnd can be obtained by, for example, Qcnd=K1×√(t). Here, a coefficient K1 is a function of a SOC and a temperature T. "t" is an elapsed time, for example, the time from time point t1 to time point tn. The energization degradation value Qcur can be obtained by, for example, Qcur=K2×√(t). Here, the coefficient K2 is a function of the SOC and the temperature T. Assuming that the SOH at time point t1 is SOHt1 and the SOH at time point tn is SOHtn, the SOH can be estimated by SOHtn=SOHt1−Qdeg. The coefficient K1 is a degradation coefficient, and the correspondence relation between each of the SOC and the temperature T and the coefficient K1 may be obtained by calculation or stored in a table form. Here, the SOC can be time-series data. A coefficient K2 is the same as the coefficient K1.

FIG. 23 is a schematic diagram showing an example of SOH estimation by the degradation simulator 50. As shown in FIG. 23, it is assumed that three pieces of SOC time-series data indicated by symbols A, B, and C are input to the degradation simulator 50. The average temperature from the time point t to the time point t+1 is input as the temperature. The SOC time-series data indicated by symbol A has a relatively small SOC variation range. On the other hand, the SOC time-series data indicated by symbol C has a relatively large SOC variation range. The SOC time-series data indicated by symbol B has a SOC variation range about the middle of both. As shown in FIG. 23, each of symbols A, B, and C indicates the estimation of the SOH by the degradation simulator 50. The SOH transition of symbol A corresponds to the SOC time-series data of symbol A, the SOH transition of symbol B corresponds to the SOC time-series data of symbol B, and the SOH transition of symbol C corresponds to the SOC time-series data of symbol C. As described above, as the SOC variation range increases, the degradation value tends to increase.

By inputting various pieces of SOC time-series data to the degradation simulator 50, it is possible to estimate degradation values (SOHs) corresponding to the various pieces of SOC time-series data and easily generate a large number of data sets of the estimation results of the SOHs corresponding to the SOC time-series data.

The processing unit 23 has a function as an output value acquisition unit and acquires a SOH output from the degradation simulator 50 when the time-series data relating to the SOC is input to the degradation simulator 50. The processing unit 23 has a function as an input value acquisition unit and acquires the time-series data relating to the SOC input to the degradation simulator 50. That is, the processing unit 23 acquires the SOC time-series data input to the degradation simulator 50 and the SOH (determined by the degradation value) output from the degradation simulator 50 at that time.

The learning processing unit 27 causes the learning model 26 to learn using the time-series data relating to the SOC input to the degradation simulator 50 and the SOH output from the degradation simulator 50 as learning data. When various pieces of SOC time-series data are input to the degradation simulator 50, the degradation simulator 50 outputs a degradation value (i.e., SOH) with high accuracy with respect to each input SOC time-series data. Various SOC time-series data can be relatively easily generated for simulation, thereby facilitating the generation of data for learning of a learning model 26 and the improvement in the estimation accuracy (percentage of correct answers) of the learning model 26.

The processing unit 23 can acquire a SOH that is output by the degradation simulator 50 to which time-series data relating to a temperature is input together with the time-series data relating to the SOC. Thus, as compared with a case where, for example, the average temperature is used as the temperature data to be input to the degradation simulator 50, the degradation value can be estimated in consideration of variation in temperature, so that the estimation accuracy of the learning model 26 can be improved.

The learning processing unit 27 can cause the learning model 26 to learn using the temperature time-series data input to the degradation simulator 50 and the SOH output from the degradation simulator 50 as learning data. Thus, the learning model 26 can be caused to learn in consideration of temperature variation as well, and the estimation accuracy of the learning model 26 can be improved.

The processing unit 23 has a function as a SOC acquisition unit and acquires time-series data relating to the SOC of the energy storage device. The processing unit 23 acquires the SOH of the energy storage device. Sensor information (e.g., current, voltage, and temperature) can be collected from the energy storage device. The SOH can be estimated by a known method based on the sensor information. Alternatively, the SOH may be estimated using a method described in Japanese Patent Application No. 2017-065532 (its entire contents are incorporated herein by reference).

The learning processing unit 27 has a function as a relearning processing unit and uses the time-series data relating to the SOC and the SOH acquired by the processing unit 23 as learning data to cause the learning model 26, caused to learn using the data of the degradation simulator 50, to relearn.

More specifically, the learning processing unit 27 causes the learning model 26, caused to learn using the data of the degradation simulator 50, to relearn based on learning data with the time-series data relating to the SOC of the energy storage device from the first time point to the second time point and the SOH at the first time point as input data and with the SOH at the second time point as output data. For example, the SOH at the first time point is represented by SOH(N), and the SOH at the second time point is represented by SOH(N+1). The learning model 26 relearns that the SOH at the first time point is SOH(N), and how the temporal variation in the SOC of the energy storage device from the first time point to the second time point transitions to make the SOH at the second time point become SOH(N+1) Thereby, when the SOH at a certain time point (e.g., at present) and the use condition of the energy storage device from time point to a prediction target point after a degradation estimation period (e.g., one month later, three months later, etc.) are input to the learning model 26, the SOH at the prediction target point can be estimated. Thereby, the degradation of the energy storage device can be estimated using the AI.

Further, the learning processing unit 27 can use the temperature data obtained from the sensor information and the acquired SOH as learning data to cause the learning model 26, caused to learn using the data of the degradation simulator 50, to relearn. Thus, the learning model 26 can be caused to learn in consideration of temperature variation as well, and the estimation accuracy of the learning model 26 can be improved.

Next, the two-dimensional image generation unit 29 will be described.

The two-dimensional image generation unit 29 has a function as a two-dimensional data generation unit and generates two-dimensional SOC data containing a plurality of time points and SOC values at the respective plurality of time points based on the SOC time-series data. In the present specification, the two-dimensional SOC data is described as a two-dimensional SOC image. The SOC time-series data may be the SOC time-series data input to the degradation simulator 50 or the SOC time-series data obtained by the current integration method based on the sensor information (e.g., current time-series data).

The two-dimensional image generation unit 29 can generate a two-dimensional temperature image including a plurality of time points and temperature values at the respective plurality of time points based on temperature time-series data.

FIG. 24 is a schematic diagram showing an example of generating a two-dimensional SOC image from SOC time-series data. FIG. 24A shows the SOC time-series data. In FIG. 24A, the vertical axis indicates the SOC (0 to 100%), and the horizontal axis indicates the time (from time points t1 to tn). The SOC time-series data is a plot of a SOC value at each of n time points from time point t1 to time point tn. FIG. 24B shows a two-dimensional SOC image and is an image made up of pixels of length×width=m×m. In the case of generating a two-dimensional SOC image, 0% to 100% of the SOC are assigned to the m vertical pixels, and times from time point t1 to tn are assigned to the m horizontal pixels. The two-dimensional SOC image can be captured as an image in which the pixel to which the SOC value is assigned is "1" and the pixel to which the SOC value is not assigned is "0." In FIG. 24B, the pixel "1" is schematically indicated by a black circle.

For example, assuming that n is 20,000 (seconds), the SOC scale is in 0.5 (%) increments, and the vertical× horizontal pixel (m×m) is 200×200, one vertical pixel in the two-dimensional SOC image corresponds to 0.5% of the SOC, and one horizontal pixel corresponds to 100 seconds. In this case, as the SOC per pixel, the average value of the SOC for 100 seconds can be used.

FIG. 25 is a schematic diagram showing an example of generating a two-dimensional temperature image from temperature time-series data. FIG. 25A shows temperature time-series data. In FIG. 25A, the vertical axis indicates the temperature (e.g., from 0° C. to 100° C.), and the horizontal axis indicates the time (from time points t1 to tn). The temperature time-series data is a plot of temperature at each of n time points from time point t1 to time point tn. FIG. 25B shows a two-dimensional temperature image and is an image made up of pixels of length×width=m×m. In the case of generating a two-dimensional temperature image, temperatures from 0° C. to 100° C. are assigned to the m vertical pixels, and times from time point t1 to tn are assigned to the m horizontal pixels. The two-dimensional temperature image can be captured as an image in which the pixel to which the temperature value is assigned is "1" and the pixel to which the temperature value is not assigned is "0." In FIG. 25B, the pixel "1" is schematically indicated by a black circle.

Figure 26:
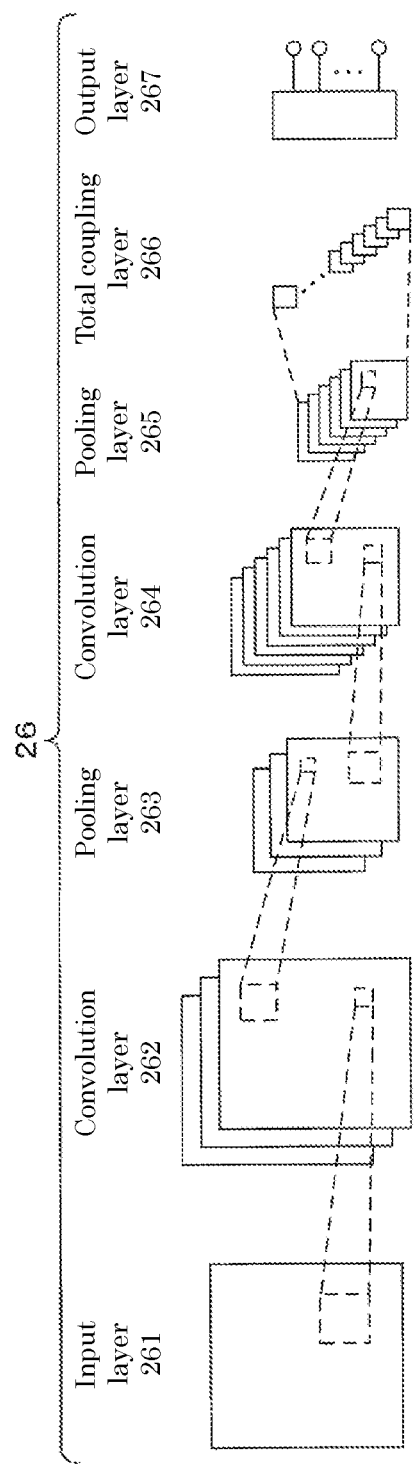
FIG. 26 is a schematic diagram showing an example of a configuration of a learning model.

FIG. 26 is a schematic diagram showing an example of the configuration of the learning model 26. In the second embodiment, the learning model 26 may be made of a convolutional neural network. In the learning model 26, an input layer 261, a convolution layer 262, a pooling layer 263, a convolution layer 264, a pooling layer 265, a total coupling layer 266, and an output layer 267 are connected in this order. The number of convolution layers, pooling layers, and total bonding layers is for convenience only and is not limited to that shown in FIG. 26. For convenience, the layer of the activation function is omitted.

The two-dimensional SOC image and the two-dimensional temperature image generated by the two-dimensional image generation unit 29 can be input to the input layer 261. Note that the input layer 581 may be made up of two channels, a two-dimensional SOC image can be input to one channel, and a two-dimensional temperature image can be input to the other channel.

The number of output nodes of the output layer 267 can be determined appropriately. For example, the number of output nodes may be 20, and output nodes 1 to 20 may each be a SOH decrease rate (1 to 20%).

The learning processing unit 27 causes the learning model 26 to learn using the two-dimensional SOC image generated by the two-dimensional image generation unit 29 as learning data.

FIG. 27 is a block diagram showing an example of data for learning using the estimated value of the degradation simulator 50. As shown in FIG. 27, the data for learning of NO. 1 may be a two-dimensional SOC image, a two-dimensional temperature image, and a SOH at time point t1, and the output data for learning may be a SOH at time point tn, as the input data for learning. The same applies to data for learning data of NO. 2 and NO. 3 and later. That is, the learning model 26 having the convolutional neural network can be caused to learn by generating the two-dimensional SOC image from the SOC time-series data input to the degradation simulator and generating the two-dimensional temperature image from the temperature time-series data input to the degradation simulator. The temporal variation in the SOC can be captured as a change in the position of the pixel on the image to cause the learning model 26 to learn. Thereby, the learning model 26 can be caused to learn so as to enable accurate estimation of the change (degradation value) of the SOH due to the variation in the SOC.

The learning processing unit 27 can use the two-dimensional SOC image generated by the two-dimensional image generation unit 29 as learning data to cause the learning model 26, caused to learn using the estimated value of the degradation simulator 50, to relearn.

FIG. 28 is a block diagram showing an example of data for learning with measured values. As shown in FIG. 28, the data for learning of NO. 1 may have the two-dimensional SOC image, the two-dimensional temperature image, and the SOH at time point t1 as input data for learning, and have the SOH at time point to as the output data for learning. The same applies to data for learning data of NO. 2 and NO. 3 and later. That is, the learning model 26 having the convolutional neural network can be caused to learn by generating the two-dimensional SOC image from the SOC time-series data obtained from the sensor information. The temporal variation in the SOC can be captured as a change in the position of the pixel on the image to cause the learning model 26 to relearn. Thereby, the learning model 26 can be caused to relearn so as to enable accurate estimation of the change (degradation value) of the SOH due to the variation in the SOC.

Figure 29:
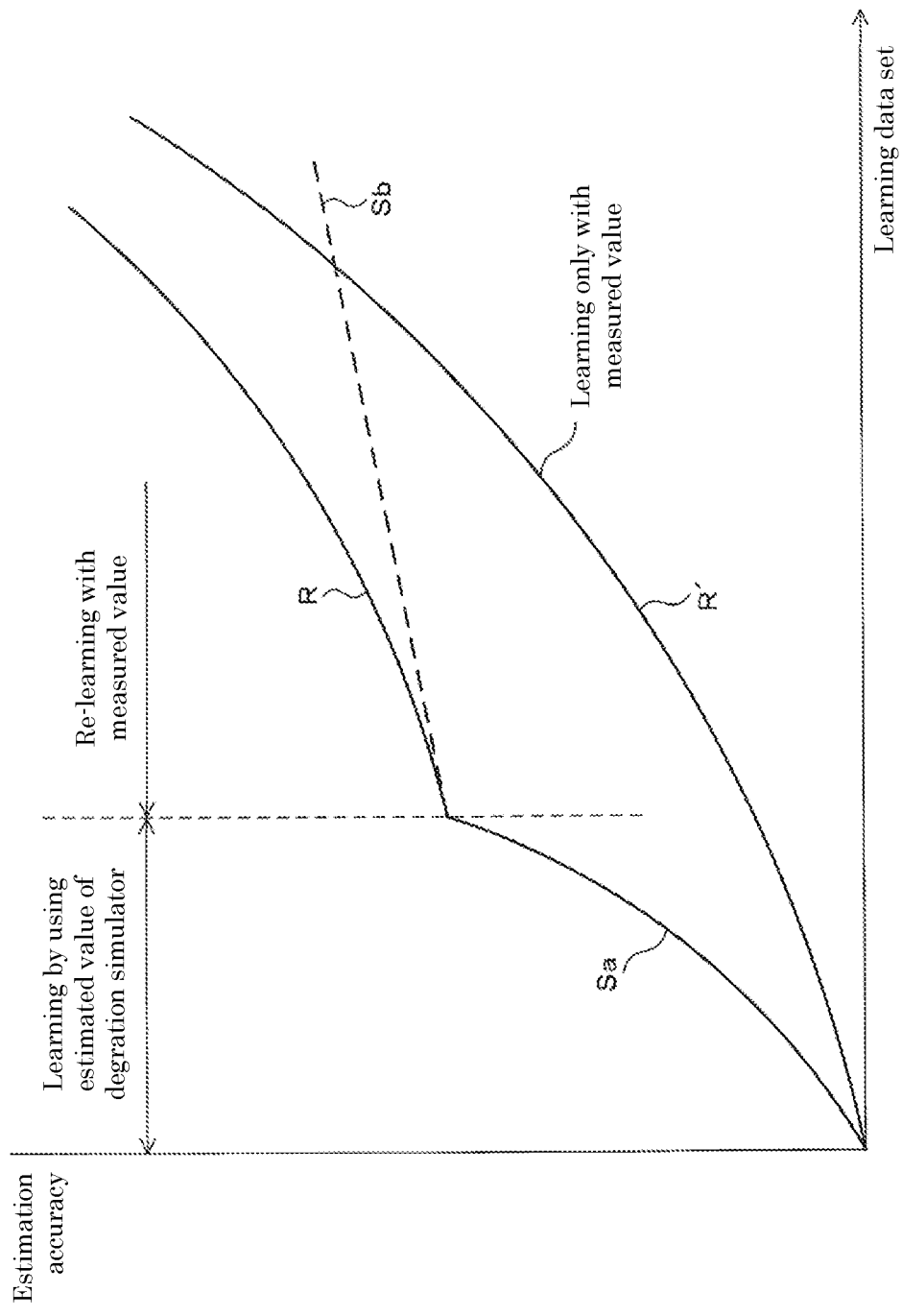
FIG. 29 is a schematic diagram showing an example of the relationship between the learning data set of the learning model and the estimation accuracy.

FIG. 29 is a schematic diagram showing an example of the relationship between the learning data set of the learning model 26 and the estimation accuracy. In FIG. 29, the vertical axis indicates the estimation accuracy (percentage of correct answers) of the learning model 26, and the horizontal axis indicates the learning data set (amount of data required for learning). A curve indicated by symbol R' represents a case of learning based only on a measured value (e.g., market data). As a curve indicated by symbol R' shows, the SOC time-series data or the SOH obtained by collecting sensor information, for example, tends to require a large amount of data for learning in order to enhance the estimation accuracy (percentage of correct answers) of the learning model 26 when the temporal variation in SOC becomes complicated and a learning model 26 not having learned is caused to learn using these pieces of data as data for learning.

A curve indicated by symbol Sa shows a case where data of the degradation simulator 50 is used as data for learning and is learned. When various pieces of SOC time-series data are input to the degradation simulator 50, the degradation simulator 50 outputs a degradation value (i.e., SOH) with high accuracy with respect to the input time-series data of each of the SOCs, thereby making it possible to easily generate data for learning of the learning model 26 and easily generate the estimation accuracy (percentage of correct answers) of the learning model 26. As a curve indicated by symbol Sa shows, by using the degradation simulator in advance, the learning data can be obtained relatively easily, and the estimation accuracy of the learning model not having learned can be enhanced. However, as shown by a curve of symbol Sb, in a case where a parameter of the degradation simulator 50 is determined, there is a tendency that a large amount of data is hardly reflected, and the estimation accuracy is not easily improved in proportion to the amount of data.

A curve indicated by symbol R shows a case where relearning is performed based on the measured value after learning has been performed using the estimated value of the degradation simulator 50. As the curve indicated by symbol "R" shows, by using the degradation simulator 50 in advance, the learning data can be obtained relatively easily, and the estimation accuracy of the learning model 26 not having learned can be enhanced. Therefore, by relearning processing, the accuracy of the learning model 26 can be further enhanced even without a large amount of data for learning, and the accuracy of the degradation estimation of the energy storage device can be enhanced.

As described above, the learning model 26 has been caused to learn using as learning data the time-series data relating to the SOC to be input to the degradation simulator 50 and the SOH to be output by the degradation simulator 50 when the time-series data relating to the SOC is input to the degradation simulator 50. The learning model 26 has been further caused to relearn using the time-series data relating to the SOC of the energy storage device and the SOH of the energy storage device as learning data.

In the learning of the learning model 26, by using the degradation simulator 50 in advance, the learning data can be obtained relatively easily, and the estimation accuracy of the learning model 26 not having learned can be enhanced. Further, by relearning, the accuracy of the learning model 26 can be further enhanced even without a large amount of data for learning, and the accuracy of the degradation estimation of the energy storage device can be enhanced.

The server apparatus 2 acquires the SOH at the first time point of the energy storage device and acquires the time-series data relating to the SOC of the energy storage device from the first time point to the second time point. The server apparatus 2 can estimate the SOH at the second time point by inputting the SOH at the first time point and the acquired time-series data relating to the SOC to the learning model 26.

When the SOH at a certain time point (e.g., at present) and the SOC time-series data from time point to a prediction target point are input to a learning-completed or relearning-completed learning model 26, a SOH at the prediction target point can be estimated. Thereby, the degradation of the energy storage device can be estimated using the AI.

Figure 30:
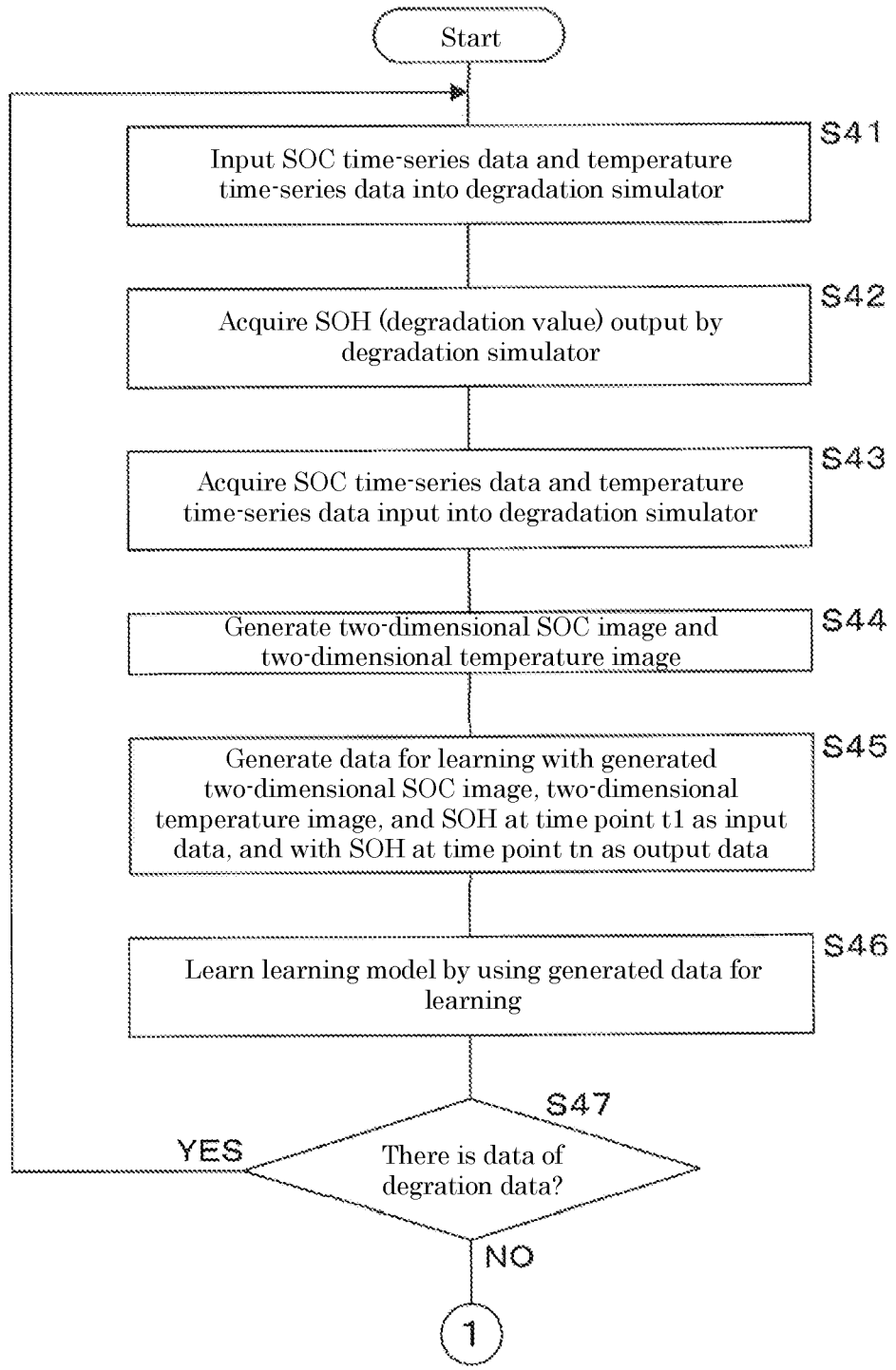
FIG. 30 is a flowchart showing an example of a processing procedure of a processing unit in the learning mode according to the second embodiment.
Figure 31:
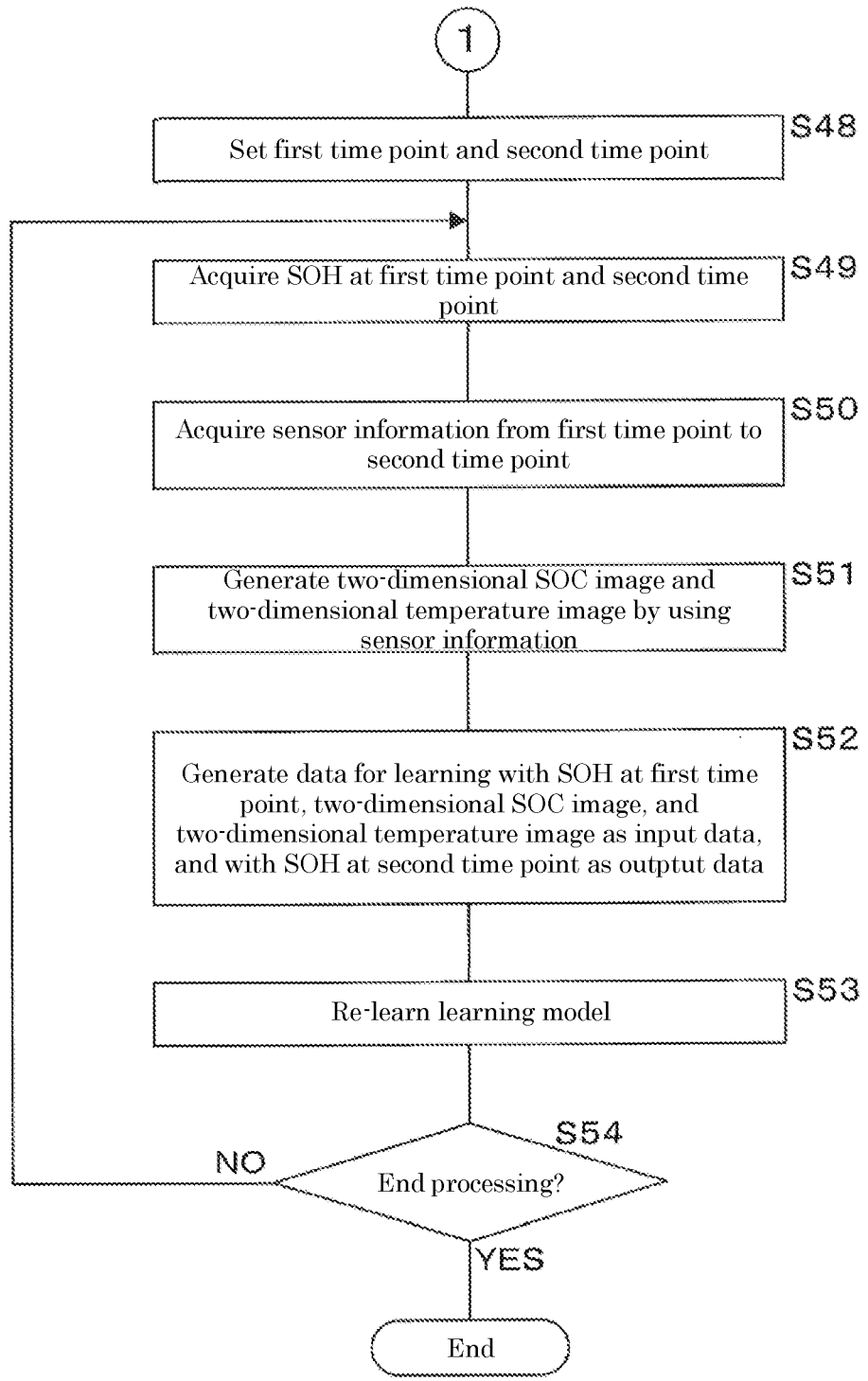
FIG. 31 is a flowchart showing an example of the processing procedure of the processing unit in the learning mode according to the second embodiment.

FIGS. 30 and 31 are flowcharts showing an example of the processing procedure of the processing unit 23 in the learning mode of the second embodiment. The processing unit 23 inputs the SOC time-series data and the temperature time-series data to the degradation simulator (S41), acquires the SOH (degradation value) output by the degradation simulator (S42), and acquires the SOC time-series data and the temperature time-series data input to the degradation simulator 50 (S43). Note that the processing in step S41 is not performed by the processing unit 23 but can be performed by another apparatus in advance.

The processing unit 23 generates a two-dimensional SOC image and a two-dimensional temperature image (S44), generates data for learning with the generated two-dimensional SOC image, the two-dimensional temperature image, and the SOH at time point t1 as input data and the SOH at time point to as output data (S45), and causes the learning model 26 to learn using the generated data for learning (S46).

The processing unit 23 determines whether or not there is data in the degradation simulator 50 (S47), and when there is data (YES in step S47), the processing unit 23 continues the processing from step S41 on and after. When there is no data (NO in S47), the processing unit 23 sets the first time point and the second time point (S48) and acquires the SOH at each of the first time point and the second time point (S49).

The processing unit 23 acquires sensor information (current data in time series, temperature data in time series, and voltage data in time series) from the first time point to the second time point (S50).

The processing unit 23 generates a two-dimensional SOC image and a two-dimensional temperature image using the acquired sensor information (S51) and generates data for learning with the SOH at the first time point, the two-dimensional SOC image, and the two-dimensional temperature image as input data and the SOH at the second time point as output data (S52).

The processing unit 23 causes the learning model 26 to relearn based on the generated data for learning (S53) and determines whether or not to end the processing (S54). When it is determined that the processing is not to be ended (NO in S54), the processing unit 23 continues the processing from step S49, and when it is determined that the processing is to be ended (YES in step S54), the processing is ended.

Third Embodiment

In the learning of the learning model 26, some of the required parameters are selected from all the parameters of the learning model 26, and the selected required parameters are determined, for example, by causing the learning model 26 to learn using the SOC representative value. Here, the SOC representative value of the energy storage device can be obtained by abstracting the detailed behavior of the energy storage device in operation from the first time point to the second time point. The SOC representative value includes, for example, an average value of SOC, a total SOC variation amount, a SOC variation range, and the like. The SOC average value is a value obtained by dividing a value, obtained by sampling and summing SOC values from the first time point to the second time point, by the number of samples, and is a central SOC. The total SOC variation amount is the integration of variation amounts along a route of how the SOC has varied from the first time point to the second time point. The SOC variation range is a difference between the maximum value and the minimum value of the SOC from the first time point to the second time point. In addition to the SOC representative value, a temperature representative value may be used.

After the required parameters are determined, all the parameters (rest) of the learning model 26 may be determined by causing the learning model 26 to learn using the time-series data (measured value) of the SOC, the temperature, or the like This can improve the accuracy of the degradation determination to enable the calculation to be converged quickly (facilitate determination of parameters).

In the embodiment described above, the server apparatus 2 has been configured to include the learning model 26 and the learning processing unit 27, but the present invention is not limited thereto. For example, the learning model 26 and the learning processing unit 27 may be provided in one or more other servers. The degradation estimation apparatus is not limited to the server apparatus 2. For example, an apparatus such as a life estimation simulator may be used.

The control unit 20 and the processing unit 23 of the present embodiment can also be achieved using a general-purpose computer provided with a CPU (processor), a GPU, a RAM (memory), and the like. That is, the control unit 20 and the processing unit 23 can be achieved on a computer by loading a computer program that determines the procedure of each processing, as shown in FIGS. 19, 20, 30, and 31, into the RAM (memory) provided in the computer and by executing the computer program with the CPU (processor). The computer program may be recorded on a recording medium and distributed. The learning model 26 caused to learn by the server apparatus 2 and the computer program based on the learning model may be distributed to and installed into the target apparatuses P, U, D, M for remote monitoring, the terminal apparatus via the network N and the communication device 1.

In the embodiment described above, the SOC and the temperature from time t1 to time point t90 are collectively input to the input layer, but the present invention is not limited thereto. For example, a recurrent neural network (RNN) may be used to learn the intermediate layer of the previous time with the input of the next time. Thus, the number of nodes in the input layer can be reduced. Alternatively, there may be used a convolutional neural network (CNN) in which a convolutional layer or a pooling layer is added to an intermediate layer. Thus, the learning model performs learning while being reflected by the relation between the SOC information and the temperature information and the relation between the local variation in the SOC information and the temperature information and the change of the SOH.

Embodiments are exemplary in all respects and are not restrictive. The scope of the present invention is defined by the claims and includes meanings equivalent to the claims and all modifications within the claims.

DESCRIPTION OF REFERENCE SIGNS

2: server apparatus
20: control unit
21: communications unit
22: storage unit
23: processing unit
24: SOC specification unit
25: learning data generation unit
26: learning model
27: learning processing unit
28: input data generation unit
29: two-dimensional image generator

The invention claimed is:

1. A degradation estimation apparatus for estimating degradation of an energy storage device, the apparatus comprising:
   a state of health (SOH) acquisition unit that acquires a SOH of an energy storage device at a first time point and a SOH at a second time point after the first time point; and
   a learning processing unit that causes a learning model to learn based on learning data with time-series data relating to a state of the energy storage device from the first time point to the second time point and the SOH at the first time point as input data and with the SOH at the second time point as output data.

2. The degradation estimation apparatus according to claim 1, wherein:
   the apparatus further comprises a current data acquisition unit that acquires current data of the energy storage device detected in time series, and
   the learning processing unit causes the learning model to learn based on time-series data relating to a state of charge (SOC) of the energy storage device from the first time point to the second time point based on the current data acquired by the current data acquisition unit.

3. The degradation estimation apparatus according to claim 2, further comprising:
   a voltage data acquisition unit that acquires voltage data of the energy storage device; and
   a correction unit that corrects data at a certain time point among the time-series data relating to the SOC based on the voltage data acquired by the voltage data acquisition unit.

4. The degradation estimation apparatus according to claim 2, further comprising:
   a storage unit that stores the current data acquired by the current data acquisition unit; and
   an erasing unit that erases the current data from the first time point to the second time point among the current data stored in the storage unit when the learning model is caused to learn based on time-series data relating to the SOC from the first time point to the second time point.

5. The degradation estimation apparatus according to claim 1, wherein:
   the apparatus further comprises a temperature data acquisition unit that acquires temperature data of the energy storage device detected in time series, and
   the learning processing unit causes the learning model to learn based on learning data with time-series data relating to temperature data of the energy storage device from the first time point to the second time point as input data.

6. The degradation estimation apparatus according to claim 1, wherein the learning processing unit causes the learning model to learn based on learning data with an elapsed period from a point of manufacturing the energy storage device to the first time point as input data.

7. The degradation estimation apparatus according to claim 1, wherein the learning processing unit causes the learning model to learn based on learning data with a total energized electricity amount from the point of manufacturing the energy storage device to the first time point as input data.

8. The degradation estimation apparatus according to claim 1, wherein the learning processing unit provides a plurality of learning periods from the first time point to the second time point over a use period of the energy storage device to cause the learning model to learn based on learning data.

9. The degradation estimation apparatus according to claim 1, wherein degradation of the energy storage device is estimated using a learning-completed learning model caused to learn by the learning processing unit.

10. A degradation estimation apparatus for estimating degradation of an energy storage device, the apparatus comprising:
- a state of health (SOH) acquisition unit that acquires a SOH at a first time point of the energy storage device; and
- a learning-completed learning model that uses time-series data relating to a state of the energy storage device from the first time point to a second time point and the SOH at the first time point as input data to estimate a SOH at the second time point.

11. A degradation estimation apparatus for estimating degradation of an energy storage device, the apparatus comprising:
- an output value acquisition unit that inputs time-series data relating to a state of charge (SOC) to a degradation simulator configured to estimate a state of health (SOH) of the energy storage device based on variation in a SOC of the energy storage device, and acquires a SOH output by the degradation simulator;
- an input value acquisition unit that acquires the time-series data relating to the SOC, input to the degradation simulator;
- a learning processing unit that uses the time-series data relating to the SOC acquired by the input value acquisition unit and the SOH acquired by the output value acquisition unit as learning data to cause a learning model to learn;
- a SOC acquisition unit that acquires a time-series data relating to the SOC of the energy storage device;
- a SOH acquisition unit that acquires a SOH of the energy storage device; and
- a relearning processing unit that uses the time-series data relating to the SOC acquired by the SOC acquisition unit and the SOH acquired by the SOH acquisition unit as learning data to cause relearning of the learning model caused to learn by the learning processing unit.

12. The degradation estimation apparatus according to claim 11, wherein:
- the SOH acquisition unit acquires a SOH of the energy storage device at a first time point and a SOH at a second time point after the first time point, and
- the SOC acquisition unit acquires time-series data relating to the SOC of the energy storage device from the first time point to the second time point.

13. The degradation estimation apparatus according to claim 11, wherein:
- the learning model has a convolutional neural network,
- the apparatus comprises a two-dimensional data generation unit that generates two-dimensional SOC data containing a plurality of time points and SOC values at the respective plurality of time points based on the time-series data relating to the SOC acquired by the input value acquisition unit, and
- the learning processing unit uses the two-dimensional SOC data generated by the two-dimensional data generation unit as learning data to cause the learning model to learn.

14. The degradation estimation apparatus according to claim 13, wherein:
- the two-dimensional data generation unit generates two-dimensional SOC data containing a plurality of time points and SOC values at the respective plurality of time points based on the time-series data relating to the SOC acquired by the SOC acquisition unit, and
- the relearning processing unit uses the two-dimensional SOC data generated by the two-dimensional data generation unit as learning data to cause the learning model, caused to learn by the learning processing unit, to relearn.

15. The degradation estimation apparatus according to claim 11, wherein the output value acquisition unit acquires a SOH that is output by the degradation simulator to which time-series data relating to a temperature is input together with the time-series data relating to the SOC.

16. The degradation estimation apparatus according to claim 15, wherein:
- the input value acquisition unit acquires time-series data relating to the temperature input to the degradation simulator, and
- the learning processing unit uses the time-series data relating to the temperature acquired by the input value acquisition unit and the SOH acquired by the output value acquisition unit as learning data to cause the learning model to learn.

17. The degradation estimation apparatus according to claim 11 wherein:
- the apparatus further comprises a temperature data acquisition unit that acquires temperature data of the energy storage device detected in time series, and
- the relearning processing unit uses the temperature data acquired by the temperature data acquisition unit and the SOH acquired by the SOH acquisition unit as learning data to cause the learning model, caused to learn by the learning processing unit, to relearn.

* * * * *